United States Patent
Lin et al.

(10) Patent No.: US 11,929,287 B2
(45) Date of Patent: Mar. 12, 2024

(54) DIELECTRIC LINER FOR FIELD EFFECT TRANSISTORS

(71) Applicant: Taiwan Semiconductor Manufacturing Co., Ltd., Hsinchu (TW)

(72) Inventors: Zhi-Chang Lin, Zhubei (TW); Shih-Cheng Chen, Taipei (TW); Kuo-Cheng Chiang, Zhubei (TW); Kuan-Ting Pan, Taipei (TW); Jung-Hung Chang, Changhua County (TW); Lo-Heng Chang, Hsinchu (TW); Chien Ning Yao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 175 days.

(21) Appl. No.: 17/238,376

(22) Filed: Apr. 23, 2021

(65) Prior Publication Data

US 2022/0344213 A1 Oct. 27, 2022

(51) Int. Cl.
*H01L 21/8234* (2006.01)
*H01L 29/423* (2006.01)
*H01L 29/786* (2006.01)

(52) U.S. Cl.
CPC ........ *H01L 21/823468* (2013.01); *H01L 29/42392* (2013.01); *H01L 29/78696* (2013.01)

(58) Field of Classification Search
CPC ......... H01L 29/42392; H01L 27/088; H01L 29/1033; H01L 21/823481; H01L 29/78696; H01L 21/823468; H01L 29/0673; H01L 29/66439; H01L 21/823418; H01L 27/0886
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,209,247 B2 | 12/2015 | Colinge et al. |
| 9,214,555 B2 | 12/2015 | Oxland et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |

(Continued)

*Primary Examiner* — Changhyun Yi
(74) *Attorney, Agent, or Firm* — Sterne, Kessler, Goldstein & Fox P.L.L.C.

(57) ABSTRACT

The present disclosure describes a semiconductor structure with a dielectric liner. The semiconductor structure includes a substrate and a fin structure on the substrate. The fin structure includes a stacked fin structure, a fin bottom portion below the stacked fin structure, and an isolation layer between the stacked fin structure and the bottom fin portion. The semiconductor structure further includes a dielectric liner in contact with an end of the stacked fin structure and a spacer structure in contact with the dielectric liner.

20 Claims, 12 Drawing Sheets

(56) References Cited

U.S. PATENT DOCUMENTS

| | | |
|---|---|---|
| 9,608,116 B2 | 3/2017 | Ching et al. |
| 9,984,936 B1* | 5/2018 | Xie .................. H01L 29/66439 |
| 2020/0105869 A1* | 4/2020 | Loubet ................ H01L 29/7851 |
| 2020/0343146 A1* | 10/2020 | Cheng ............... H01L 21/76831 |

* cited by examiner

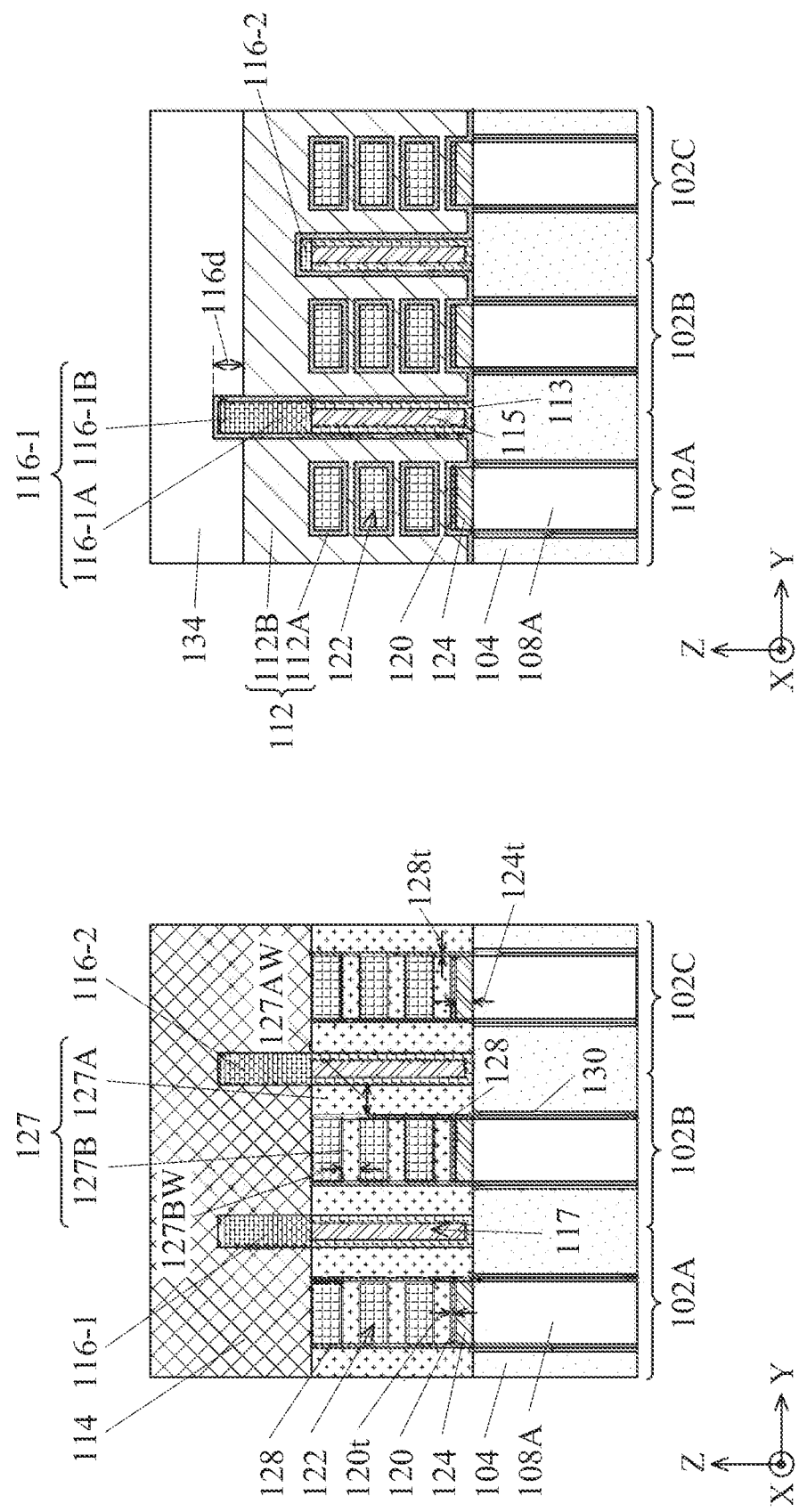

DIELECTRIC LINER FOR FIELD EFFECT TRANSISTORS

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 1A and 1B-1D illustrate an isometric view and cross-sectional views of a semiconductor device with a dielectric liner, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
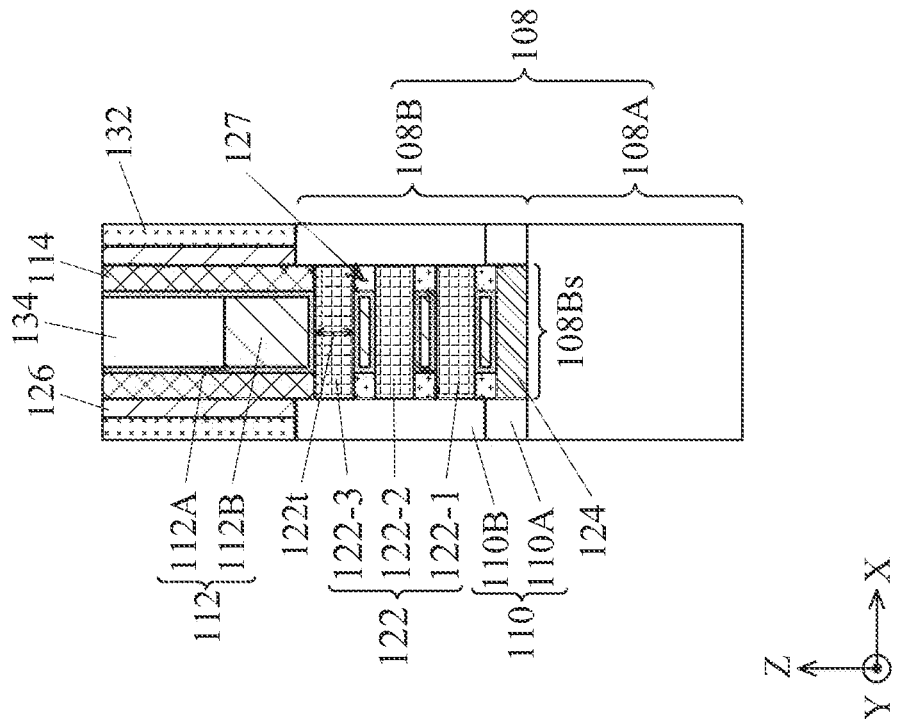

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

With advances in semiconductor technology, multi-gate devices have been introduced to improve gate control by increasing gate-channel coupling, to reduce off-state current, and to reduce short-channel effects (SCEs). One such multi-gate device that has been introduced is the gate-all-around fin field effect transistor (GAA finFET). The GAA finFET device provides a channel in a stacked nanosheet/nanowire configuration. The GAA finFET device derives its name from the gate structure that can extend around the channel and provide gate control of the channel on two or four sides of the channel. GAA finFET devices are compatible with MOSFET manufacturing processes and their structure allows them to be scaled while maintaining gate control and mitigating SCEs.

With increasing demand for lower power consumption and higher performance of semiconductor devices, GAA finFET devices can have their challenges. For example, an isolation layer, which can be formed between the stacked nanosheets/nanowires and fin bottom portion to avoid sub-channel formation and improve gate control, can protrude into the gate area and block the metal gate fill between the stacked nanosheets/nanowires, which can reduce the formation window of a replacement metal gate. In addition, the spacer structure adjacent to the ends of the stacked nanosheets/nanowires may have voids or seams due to intersections between a horizontal portion and a vertical portion of the spacer structure. Furthermore, the nanosheets/nanowires may have uniformity issues during sheet formation processes.

Various embodiments in the present disclosure provide methods for forming a semiconductor device with a dielectric liner. The example methods in the present disclosure can form a semiconductor device having a fin structure, an isolation layer between a stacked fin structure and a bottom fin portion of the fin structure, a dielectric liner in contact with the ends of the stacked fin structure, and a spacer structure in contact with the dielectric liner. In some embodiments, the dielectric liner can include silicon oxide. The dielectric liner can prevent an over etch during the formation of the isolation layer and improve the formation window of the replacement metal gate. In some embodiments, the dielectric liner can improve the formation window of the spacer structure to avoid voids and seams. In some embodiments, sheets of semiconductor layers in the stacked fin structure can be formed in two steps with the dielectric liner, which can improve the uniformity of the semiconductor layers.

Figure 1A:
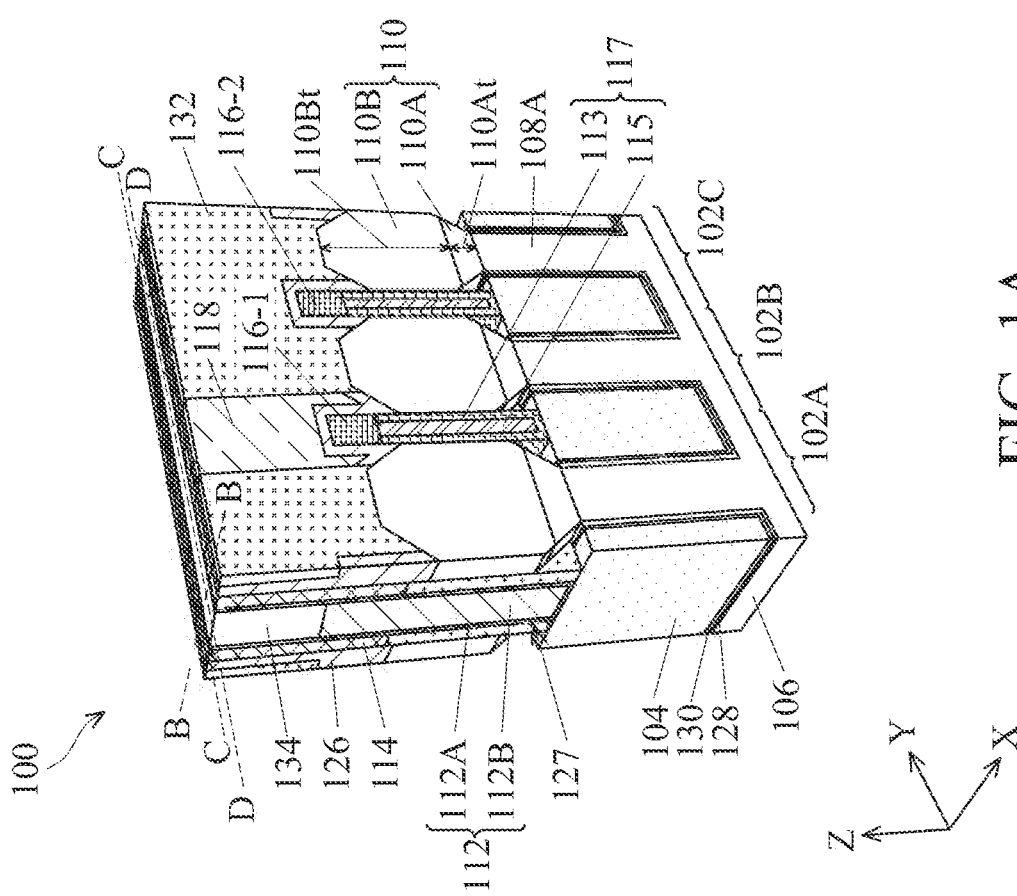

A semiconductor device 100 with a dielectric liner 128 is described with reference to FIGS. 1A-1D, according to some embodiments. FIG. 1A illustrates an isometric view of semiconductor device 100, according to some embodiments. FIG. 1B illustrates a cross-sectional view along line B-B of semiconductor device 100, FIG. 1C illustrates a cross-sectional view along line C-C of semiconductor device 100, and FIG. 1D illustrates a cross-sectional view along line D-D of semiconductor device 100, according to some embodiments.

In some embodiments, semiconductor device 100 can include finFETs 102A-102C and finFETs 102A-102C can be all p-type finFETs (PFETs), n-type finFETs (NFETS), or one of each conductivity type finFET. The term "p-type" can be associated with a structure, layer, and/or region doped with p-type dopants, such as boron. The term "n-type" can be associated with a structure, layer, and/or region doped with n-type dopants, such as phosphorus. In some embodiments, finFET 102A can be an NFET, finFET 102B can be a PFET, and finFET 102C can be an NFET. Though FIGS. 1A-1D show three GAA finFETs, semiconductor device 100 can have any number of GAA finFETs. In addition, semiconductor device 100 can be incorporated into an integrated circuit (IC) through the use of other structural components, such as contacts, conductive vias, conductive lines, dielectric layers, passivation layers, interconnects, etc., that are not shown for simplicity. The discussion of elements of finFETs 102A-102C with the same annotations applies to each other, unless mentioned otherwise.

Referring to FIGS. 1A-1D, finFETs 102A-102C can be formed on a substrate 106. In some embodiments, substrate 106 can include a semiconductor material such as crystalline silicon. In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenide phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Alternatively, substrate 106 may be made from an electrically non-conductive material, such as glass and sapphire wafer. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic). For example purposes, substrate 106 will be described in the context of crystalline silicon (Si).

Referring to FIGS. 1A-1D, semiconductor device 100 can further include shallow trench isolation (STI) regions 104, fin structures 108, gate structures 112, gate spacers 114, an interlayer dielectric (ILD) layer 118, an etch stop layer (ESL) 126, source/drain (S/D) contact structures 132, and a gate capping structure 134. STI regions 104 can provide electrical isolation between finFETs 102A-102C from each other and from neighboring finFETs with different fin structures (not shown) on substrate 106 and/or neighboring active and passive elements (not shown) integrated with or deposited on substrate 106. STI regions 104 can be made of a dielectric material. In some embodiments, STI regions 104 can include silicon oxide, silicon nitride, silicon oxynitride, fluorine-doped silicate glass (FSG), a low-k dielectric material, and/or other suitable insulating materials. The term "low-k" can refer to a small dielectric constant. In the field of semiconductor device structures and manufacturing processes, low-k can refer to a dielectric constant that is less than the dielectric constant of $SiO_2$ (e.g., less than about 3.9). In some embodiments, STI regions 104 can include a multi-layered structure.

Referring to FIGS. 1A-1D, fin structures 108 can extend on substrate 106 along an X-axis and through finFETs 102A-102C. Fin structures 108 can include fin bottom portions 108A and fin top portions 108B disposed on fin bottom portions 108A. In some embodiments, fin bottom portions 108A can include material similar to substrate 106. Fin bottom portions 108A can be formed from a photolithographic patterning and an etching of substrate 106. In some embodiments, fin top portions 108B can include stacked fin structures 108Bs, epitaxial fin structures 110, an isolation layer 124, and a capping layer 120. Each of stacked fin structures 108Bs can include a stack of semiconductor layers 122-1, 122-2, and 122-3 (collectively referred to as "semiconductor layers 122"), which can be in the form of nanosheets or nanowires. Each of semiconductor layers 122 can form a channel region underlying gate structures 112 of finFETs 102A-102C.

In some embodiments, semiconductor layers 122 can include semiconductor materials similar to or different from substrate 106. In some embodiments, each of semiconductor layers 122 can include Si without any substantial amount of Ge. The semiconductor materials of semiconductor layers 122 can be undoped or can be in-situ doped during their epitaxial growth process. Semiconductor layers 122 can have respective vertical dimensions $122t$ (e.g., thicknesses) along a Z-axis, each ranging from about 5 nm to about 10 nm. Other dimensions and materials for semiconductor layers 122 are within the scope and spirit of this disclosure. Though three layers of semiconductor layers 122 are shown in FIGS. 1A-1D, finFETs 102A-102C can have any number of semiconductor layers 122.

Referring to FIGS. 1A-1D, epitaxial fin structures 110 can be grown on portions of the respective fin bottom portions 108A that are not underlying gate structures 112. Epitaxial fin structures 110 can be in contact with both ends of stacked fin structures 108Bs. In some embodiments, epitaxial fin structures 110 can have any geometric shape, such as a polygon, an ellipsis, and a circle. Epitaxial fin structures 110 can include an epitaxial-grown semiconductor material. In some embodiments, the epitaxial-grown semiconductor material includes a same material as or different material from substrate 106. In some embodiments, the epitaxial-grown semiconductor material for epitaxial fin structures 110 can be the same as or different from each other.

Epitaxial fin structures 110 can include multiple fin regions that can differ from each other based on, for example, doping concentration, and/or epitaxial growth process conditions. Referring to FIGS. 1A and 1B, Epitaxial fin structures 110 can include first epitaxial fin region 110A and second epitaxial fin region 110B. In some embodiments, first epitaxial fin region 110A can be intrinsic and un-doped to reduce parasitic capacitance between gate structures 112 and epitaxial fin structures 110. In some embodiments, second epitaxial fin region 110B can be doped to reduce contact resistances between S/D contact structures 132 and epitaxial fin structures 110. In some embodiments, first epitaxial fin region 110A can have a vertical dimension 110At (e.g., thickness) along a Z-axis ranging from about 5 nm to about 20 nm. In some embodiments, a top surface of first epitaxial fin region 110A can be below semiconductor layers 122 of stacked fin structures 108Bs. If vertical dimension 110At is greater than about 20 nm, or the top surface of first epitaxial fin region 110A is above a bottom surface of semiconductor layers 122, contact resistance between stacked fin structures 108Bs and epitaxial fin structures 110 may be increased. If vertical dimension 110At is less than about 5 nm, parasitic capacitance between gate structures 112 and epitaxial fin structures 110 may be increased. In some embodiments, second epitaxial fin region 110B can have a vertical dimension 110Bt (e.g., thickness) along a Z-axis ranging from about 15 nm to about 50 nm. A ratio between vertical dimensions 110Bt and 110At can range from about 3 to about 10.

First epitaxial fin region 110A can include un-doped intrinsic silicon for n-type finFETs and can include un-doped intrinsic silicon germanium (SiGe) for p-type finFETs. In some embodiments, first epitaxial fin region 110A of finFETs 102A and 102C can include un-doped intrinsic silicon and first epitaxial fin region 110A of finFET 102B can include un-doped intrinsic silicon germanium.

Second epitaxial fin region 110B can be doped p-type or n-type for finFETs 102A-102C, respectively. In some embodiments, second epitaxial fin region 110B of finFETs 102A and 102C can be doped n-type and second epitaxial fin region 110B of finFET 102B can be doped p-type. P-type second epitaxial fin region 110B can include SiGe and can be in-situ doped during an epitaxial growth process using p-type dopants, such as boron, indium, and gallium. For p-type in-situ doping, p-type doping precursors such as, but not limited to, diborane ($B_2H_6$), boron trifluoride ($BF_3$), and other p-type doping precursors can be used. In some embodiments, n-type second epitaxial fin region 110B can include Si and may be in-situ doped during an epitaxial growth process using n-type dopants, such as phosphorus and arsenic. For n-type in-situ doping, n-type doping precursors such as, but not limited to, phosphine ($PH_3$), arsine ($AsH_3$), and other n-type doping precursor can be used.

Referring to FIGS. 1A-1D, fin structures 108 can be current-carrying structures for respective finFETs 102A-102C. Epitaxial fin structures 110 of finFETs 102A-102C can function as source/drain (S/D) regions. Channel regions of finFETs 102A-102C can be formed in semiconductor layers 122 of stacked fin structures 108Bs underlying gate structures 112.

Referring to FIGS. 1A-1D, isolation layer 124 between stacked fin structures 108Bs and fin bottom portions 108A can prevent sub-channel formation under stacked fin structures 108Bs. Isolation layer 124 can be made of a dielectric material. In some embodiments, Isolation layer 124 can include silicon oxide, silicon nitride, silicon oxynitride, a low-k dielectric material, and/or other suitable insulating materials. In some embodiments, isolation layer 124 can have a vertical dimension 124t (e.g., thickness) along a Z-axis ranging from about 5 nm to about 15 nm. A ratio of vertical dimensions 124t to 122t can range from about 0.5 to about 3. If vertical dimension 124t is less than about 5 nm, or the ratio is less than about 0.5, isolation layer 124 may not prevent sub-channel formation under stacked fin structures 108Bs. If vertical dimension 124t is greater than about 15 nm, or the ratio is greater than about 3, dielectric materials may not fill the openings to form isolation layer 124 shown in FIG. 10. Other materials and dimensions for isolation layer 124 are within the scope and spirit of this disclosure.

Referring to FIGS. 1A-1D, capping layer 120 between stacked fin structures 108Bs and isolation layer 124 can prevent isolation layer 124 extrusion into gate structures 112 during formation of isolation layer 124. Capping layer 120 can include semiconductor materials similar to or different from semiconductor layers 122. In some embodiments, capping layer 120 can include Si without any substantial amount of Ge. The semiconductor materials of capping layer 120 can be undoped or can be in-situ doped during its epitaxial growth process. Capping layer 120 can have a thickness 120t along a Z-axis ranging from about 0.5 nm to about 5 nm. Other dimensions and materials for capping layer 120 are within the scope and spirit of this disclosure.

Referring to FIGS. 1A-1D, gate structures 112 can be multi-layered structures and can be wrapped around semiconductor layers 122 of stacked fin structures 108Bs. In some embodiments, each of semiconductor layers 122 can be wrapped around by one of gate structures 112 or one or more layers of one of gate structures 112, for which gate structures 112 can be referred to as "gate-all-around (GAA) structures" and finFETs 102A-102C can also be referred to as "GAA FETs 102A-102C" or "GAA finFETs 102A-102C."

Each of gate structures 112 can include a gate dielectric layer 112A disposed on semiconductor layers 122 and a gate electrode 112B disposed on gate dielectric layer 112A. As shown in FIG. 1D, gate dielectric layer 112A can be wrapped around each of semiconductor layers 122, and thus, electrically isolate semiconductor layers 122 from each other and from conductive gate electrode 112B to prevent shorting between gate structures 112 and semiconductor layers 122 during operation of finFETs 102A-102C. Gate dielectric layer 112A can include a single insulating layer or a stack of insulating material layers. In some embodiments, gate dielectric layer 112A can include an interfacial layer and a high-k gate dielectric layer. In some embodiments, the high-k gate dielectric layer can include high-k dielectric materials, such as hafnium oxide. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9).

Gate electrode 112B can include a single metal layer or a stack of metal layers. In some embodiments, each gate electrode 112B can include a gate barrier layer, a gate work function layer, and a gate metal fill layer. In some embodiments, gate electrode 112B can include conductive materials, such as titanium (Ti), tantalum (Ta), titanium nitride (TiN), tantalum nitride (TaN), aluminum (Al), copper (Cu), tungsten (W), cobalt (Co), titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), nickel (Ni), titanium carbide (TiC), titanium aluminum carbide (TiAlC), tantalum aluminum carbide (TaAlC), and other suitable conductive materials.

Referring to FIGS. 1A-1D, gate spacers 114 can form on sidewalls of gate structures 112 and can be in contact with portions of gate dielectric layer 112A, according to some embodiments. Gate spacers 114 can include insulating material, such as silicon oxide, silicon nitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

ESL 126 can be formed on high-k dielectric structures 116-1 and 116-2 and epitaxial fin structures 110 to protect portions of epitaxial fin structures 110 that are not in contact with S/D contact structures 132. This protection can be provided, for example, during formation of ILD layer 118 and/or S/D contact structures 132. In some embodiments, ESL 126 can include silicon nitride ($SiN_x$), silicon oxide ($SiO_x$), silicon oxynitride (SiON), or a combination thereof.

ILD layer 118 can be disposed on ESL 126. ILD layer 118 can include a dielectric material deposited using a deposition method suitable for flowable dielectric materials. For example, flowable silicon oxide can be deposited using flowable CVD (FCVD). In some embodiments, the dielectric material can include silicon oxide.

S/D contact structures 132 can electrically connect respective SID regions (e.g., epitaxial fin structures 110) of finFETs 102A-102C to other elements of semiconductor device 100 and/or of the integrated circuit. S/D contact structures 132 can be formed within ILD layer 118. In some embodiments, S/D contact structures 132 can include metal silicide layers and conductive regions. In some embodiments, metal silicide layers can include metal silicide and can provide a low resistance interface between respective conductive regions and corresponding S/D regions of finFETs 102A-102C. Examples of metal used for forming the metal silicide are Co, Ti, and Ni. In some embodiments, conductive regions can further include metal capping layers and metal layers. In some embodiments, conductive regions can include conductive materials, such as TiN, Ti, Ni, TiSiN, TaN, Ta, W, Al, and Co.

Gate capping structure 134 can be disposed on gate structures 112 and configured to protect underlying structures and/or layers during subsequent processing of semiconductor device 100. For example, gate capping structure 134 can act as an etch stop layer during the formation of S/D contact structures 132. Gate capping structure 134 can include one or more layers of insulating material having (i) a nitride-based material, such as silicon nitride; (ii) a carbide-based material, such as silicon carbide; (iii) an elementary semiconductor, such as silicon; (iv) a metal oxide-based material; or (v) a combination thereof. In some embodiments, gate capping structure 134 can include a stack of layers of insulating material, where each layer of the stack can have a material and dimensions different from other layers in the stack.

Referring to FIGS. 1A-1D, semiconductor device 100 can further include spacer structures 127, hybrid structures 117, high-k dielectric structures 116-1 and 116-2 (collectively referred to as "high-k dielectric structures 116"), a dielectric liner 128, and a semiconductor liner 130. Spacer structures 127 can be disposed adjacent to the ends of semiconductor layers 122 in stacked fin structures 108Bs and between gate structures 112 and epitaxial fin structures 110. Spacer structures 127 can include a dielectric material, such as silicon oxycarbide (SiOC), silicon carbon-nitride (SiCN), silicon oxycarbonitride (SiOCN), silicon nitride (SiNx), silicon oxide (SiOx), silicon oxynitride (SiON), and a combination thereof. In some embodiments, spacer structures 127 can include a single layer or multiple layers of insulating materials. In some embodiments, spacer structures 127 can isolate gate structures 112 and epitaxial fin structures 110.

In some embodiments, spacer structures 127 can have a vertical portion 127A between stacked fin structures 108Bs and hybrid structures 117 and a horizontal portion 127B between semiconductor layers 122 in stacked fin structures 108Bs. In some embodiments, vertical portion 127A can have a horizontal dimension 127AW (e.g., width) along a Y-axis ranging from about 5 nm to about 15 nm. Horizontal portion 127B can have a vertical dimension 127BW (e.g., width) along a Z-axis ranging from about 5 nm to about 15 nm. If horizontal dimension 127AW or vertical dimension 127BW is less than about 5 nm, gate electrode 112B may not fill the spacings between semiconductor layers 122. If horizontal dimension 127AW or vertical dimension 127BW is greater than about 15 nm, dielectric materials may not fill the lateral recess of semiconductor layers 312 and cladding layer 638 to form spacer structures 127 shown in FIGS. 11 and 12. In some embodiments, horizontal dimension 127AW can be equal or greater than vertical dimension 127BW. In some embodiments, a ratio between horizontal dimension 127AW and vertical dimension 127BW can range from about 1 to about 1.5. If the ratio is less than about 1, gate electrode 112B may not fill the spacings between semiconductor layers 122. If the ratio is greater than about 1.5, dielectric materials may not fill the lateral recess of semiconductor layers 312 and cladding layer 638 to form spacer structures 127 shown in FIGS. 11 and 12.

Referring to FIGS. 1A-1D, hybrid structures 117 and high-k dielectric structures 116 can provide electrical isolation between finFETs 102A-102C from each other. As shown in FIG. 1D, high-k dielectric structures 116-1 can have a first portion 116-1A in gate structures 112 and a second portion 116-1B in gate capping structure 134. In some embodiments, a vertical dimension 116d (e.g., distance) along a Z-axis between a top surface of high-k dielectric structures 116-1 and a top surface of gate structures 112 can range from about 5 nm to about 30 nm. If vertical dimension 116d is less than about 5 nm, gate structures 112 of finFET 102A may not be electrically isolated from gate structures 112 of finFETs 102B and 102C. If vertical dimension 116d is greater than about 30 nm, gate structures 112 of finFET 102B and 102C may not be electrically connected. A top surface of high-k dielectric structures 116-2 can be below a top surface of gate structures 112 and at a similar level to a top surface of semiconductor layers 122. As a result, gate structures 112 of finFET 102B and 102C can be electrically connected and high-k dielectric structures 116-1 can electrically isolate gate structures 112 of finFET 102A from gate structures 112 of finFETs 102B and 102C. In some embodiments, high-k dielectric structures 116 can include high-k dielectric materials, such as hafnium oxide. In some embodiments, hybrid structures 117 can include a first hybrid layer 113 and a second hybrid layer 115. In some embodiments, first hybrid layer 113 can include a dielectric material, such as silicon oxycarbonitride (SiOCN), and second hybrid layer 115 can include a dielectric material, such as silicon oxide (SiOx).

Referring to FIGS. 1A-1D, dielectric liner 128 and semiconductor liner 130 can be disposed between STI regions 104 and fin structures 108. As shown in FIG. 1C, dielectric liner 128 can extend above fin bottom portions 108A and can be disposed between semiconductor layers 122 in stacked fin structures 108Bs and spacer structures 127. In some embodiments, dielectric liner 128 can include dielectric materials, such as silicon oxide (SiOx) and silicon oxycarbonitride (SiOCN). In some embodiments, dielectric liner 128 can prevent oxidation of the sidewalls of stacked fin structures 108Bs during the formation of STI regions 104. In some embodiments, dielectric liner 128 can prevent an over etch during formation of isolation layer 124 and improve the formation window of gate structures 112. In some embodiments, dielectric liner 128 can improve the formation window of spacer structures 127. In some embodiments, sheets of semiconductor layers 122 can be formed in two steps with dielectric liner 128, which can improve the uniformity of sheets of semiconductor layers 122. In some embodiments, dielectric liner 128 can have a horizontal dimension 128t (e.g., thickness) along a Y-axis ranging from about 0.5 nm to about 2.5 nm. A ratio of horizontal dimension 128t to horizontal dimension 122t can range from about 0.05 to about 0.5. If horizontal dimension 128t is less than about 0.5 nm, or the ratio is less than about 0.05, dielectric liner 128 may not prevent an over etch during formation of isolation layer 124. If horizontal dimension 128t is greater than about 2.5 nm, or the ratio is greater than about 0.5, parasitic capacitance between gate structures 112 and epitaxial fin structures 110 may be increased.

Semiconductor liner 130 can include semiconductor materials similar to or different from semiconductor layers 122. In some embodiments, semiconductor liner 130 can include Si. In some embodiments, semiconductor liner 130 can include SiGe. In some embodiments, semiconductor liner 130 can have a thickness ranging from about 0.5 nm to about 2 nm. In some embodiments, semiconductor liner 130 can be optional. Semiconductor liner 130 can facilitate the formation of spacer structures 127.

Figure 2:
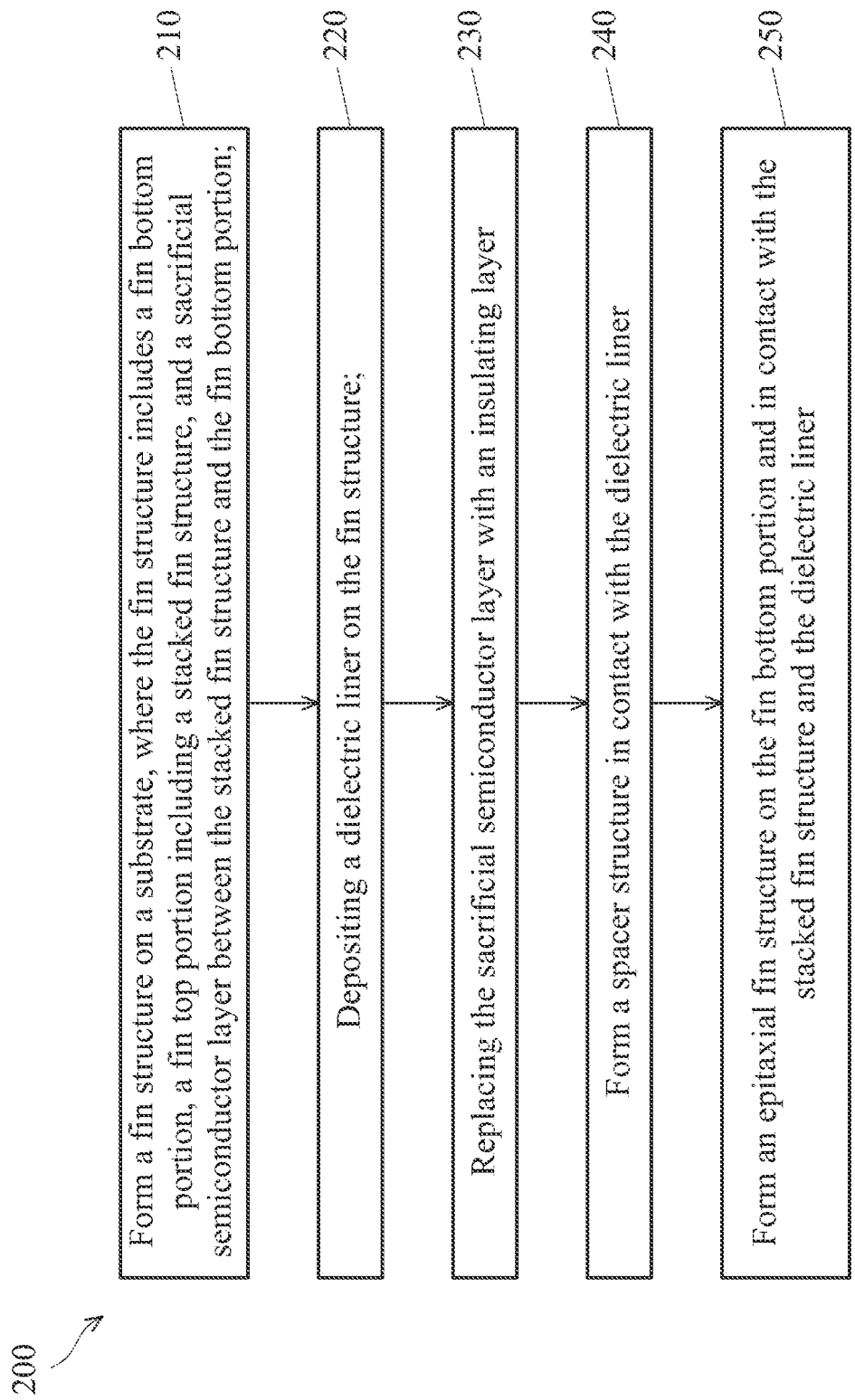
FIG. 2 is a flow diagram of a method for fabricating a semiconductor device with a dielectric liner, in accordance with some embodiments.

FIG. 2 is a flow diagram of a method 200 for fabricating semiconductor device 100 with dielectric liner 128, in accordance with some embodiments. Additional fabrication operations may be performed between various operations of method 200 and may be omitted merely for clarity and ease of description. Additionally, some of the operations may be performed simultaneously, or in a different order than the ones shown in FIG. 2. Accordingly, additional processes can be provided before, during, and/or after method 200; these additional processes can be briefly described herein. For example purposes, the operations illustrated in FIG. 2 will be described with reference to the example fabrication process for fabricating semiconductor device 100 as illustrated in FIGS. 3-20. FIGS. 3-20 are partial isometric views of semiconductor device 100 at various stages of its fabrication, according to some embodiments. Although FIGS. 3-20 illustrate fabrication processes of semiconductor device 100 with dielectric liner 128, method 200 can be applied other semiconductor devices with dielectric liner 128. Elements in FIGS. 3-20 with the same annotations as elements in FIGS. 1A-1D are described above.

Figure 3:
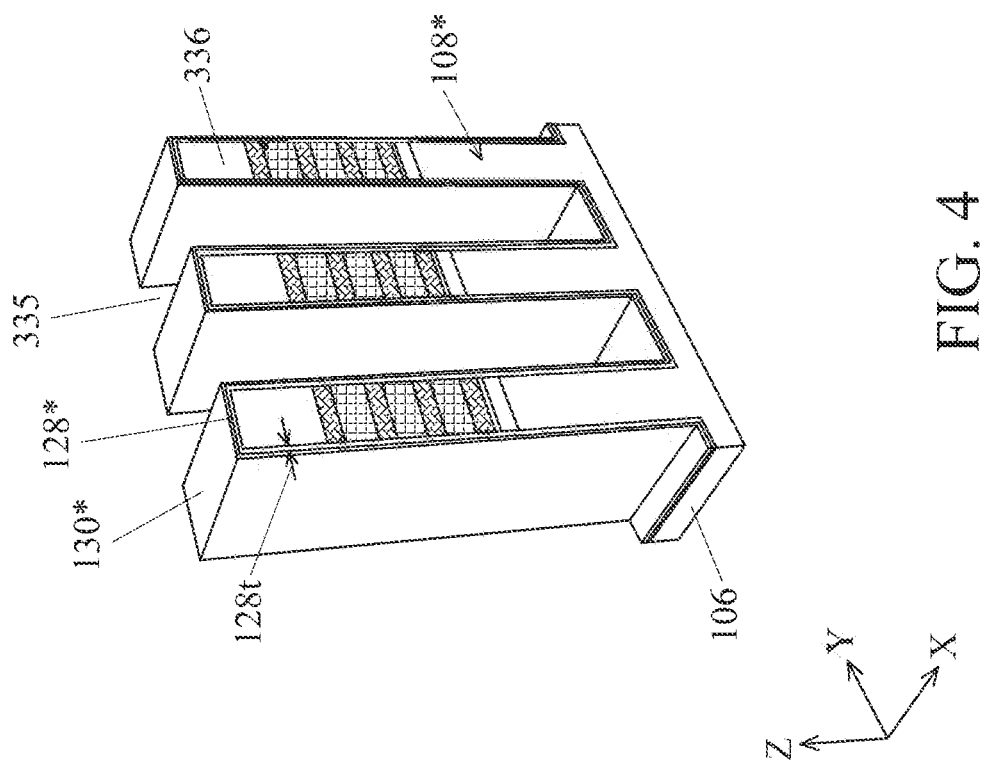
FIGS. 3-20 illustrate partial isometric views of a semiconductor device with a dielectric liner at various stages of its fabrication process, in accordance with some embodiments.

In referring to FIG. 2, method 200 begins with operation 210 and the process of forming a fin structure on a substrate. For example, as shown in FIG. 3, fin structures 108* with fin bottom portions 108A* and fin top portions 108B* can be formed on substrate 106. Fin top portions 108B* can include stacked fin structures 108Bs*, each of which can further include a sacrificial semiconductor layer 324 on fin bottom portions 108A*, capping layer 120 on sacrificial semiconductor layer 324, semiconductor layers 122, and semiconductor layers 312-1, 312-2, 312-3, and 312-4 (collectively referred to as "semiconductor layers 312").

Each semiconductor layer in stacked fin structures 108Bs* can be epitaxially grown on its underlying layer followed by a vertical etch to form openings 335. A hard mask layer 336 can be deposited on semiconductor layers 122 and 312 and patterned to form openings 335 and fin structures 108*. In some embodiments, S/D regions can be formed in openings 335 in subsequent processes. In some embodiments, the vertical etch of semiconductor layers 122 and 312, capping layer 120, and sacrificial semiconductor layer 324 can include a biased etching process. In some embodiments, the biased etching process can be directional and semiconductor layers 122 and 312, capping layer 120, and sacrificial semiconductor layer 324 can have substantially no lateral etch.

Semiconductor layers 312 and 122 can include semiconductor materials similar to or different from substrate 106. In some embodiments, semiconductor layers 312 and 122 can include semiconductor materials with oxidation rates and/or etch selectivity different from each other. The term "etch selectivity" can refer to the ratio of the etch rates of two different materials under the same etching conditions. In some embodiments, semiconductor layers 312 can include silicon germanium (SiGe) with Ge in a range from about 10 atomic percent to about 20 atomic percent with any remaining atomic percent being Si. In some embodiments, semiconductor layers 122 can include Si without any substantial amount of Ge. Semiconductor layers 312 can have a vertical dimension 312t (e.g., thickness) along a Z-axis ranging from about 5 nm to about 12 nm. Semiconductor layers 122 can have a vertical dimension 122t (e.g., thickness) along a Z-axis ranging from about 5 nm to about 10 nm. Thicknesses of semiconductor layers 312 and 122 can be equal to or different from each other. Though three semiconductor layers 122 and four semiconductor layers 312 for stacked fin structures 108Bs* are shown in FIG. 3, semiconductor device 100 can have any number of semiconductor layers 312 and 122.

Sacrificial semiconductor layer 324 can include semiconductor materials similar to or different from semiconductor layers 312. In some embodiments, sacrificial semiconductor layer 324 can include SiGe with Ge in a range from about 30 atomic percent to about 40 atomic percent with any remaining atomic percent being Si. In some embodiments, sacrificial semiconductor layer 324 can include SiGe with a higher Ge concentration than semiconductor layers 312 for a higher etch rate, and a difference between the Ge concentration in sacrificial semiconductor layer 324 and semiconductor layers 312 can range from about 20 atomic percent to about 30 atomic percent. If the difference is less than about 20 atomic percent, sacrificial semiconductor layer 324 may not have a higher etch rate than semiconductor layers 312 and sacrificial semiconductor layer 324 may not be fully replaced by isolation layer 124. If the difference is greater than about 30 atomic percent, sacrificial semiconductor layer 324, semiconductor layers 312, and semiconductor layers 122 may have more epitaxial defects and stress between each layer. Sacrificial semiconductor layer 324 can have a thickness 324t along a Z-axis ranging from about 5 nm to about 15 nm.

Capping layer 120 can include semiconductor materials similar to or different from semiconductor layers 122. In some embodiments, capping layer 120 can include Si without any substantial amount of Ge. The semiconductor materials of capping layer 120 can be undoped or can be in-situ doped during its epitaxial growth process. Capping layer 120 can have a thickness 120t along a Z-axis ranging from about 0.5 nm to about 5 nm. Capping layer 120 can protect semiconductor layers 312 during subsequent formation of isolation layer 124. If thickness 120t is less than about 0.5 nm, capping layer 120 may not protect semiconductor layers 312 during subsequent formation of isolation layer 124. If thickness 120t is greater than about 5 nm, isolation layer 124 may not prevent sub-channel formation under stacked fin structures 108Bs.

Figure 4:
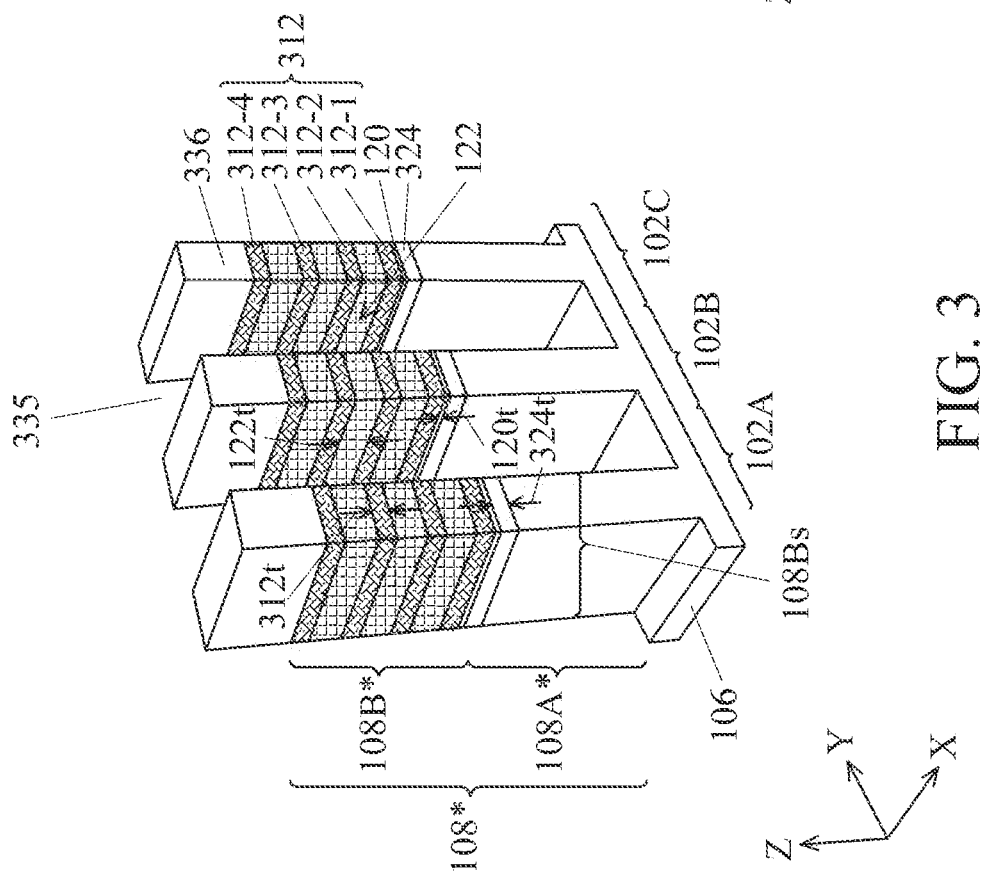

Referring to FIG. 2, in operation 220, a dielectric liner is deposited on the fin structure. For example, as shown in FIG. 4, dielectric liner 128* can be conformally deposited on fin structures 108*. In some embodiments, dielectric liner 128* can include dielectric materials, such as silicon oxide (SiOx) and silicon oxycarbonitride (SiOCN), deposited by atomic layer deposition (ALD) or other suitable conformal deposition methods to improve step coverage. Dielectric liner 128* can be deposited at a temperature ranging from about 100° C. to about 400° C., using silane (SiH$_4$) and oxygen as precursors. If the temperature is higher than about 400° C., stacked fin structures 108Bs* may be oxidized and silicon and germanium of each semiconductor layer may diffuse into and intermix with stacked fin structures 108Bs*. If the temperature is lower than about 100° C., dielectric liner 128* may not reach the required quality (e.g., conformal deposition). In some embodiments, dielectric liner 128* can be deposited at a deposition rate ranging from about 0.1 nm/s to about 10 nm/s. If the deposition rate is less than about 0.1 nm/s, the deposition process time may be longer than required. If the deposition rate is greater than about 10 nm/s, dielectric liner 128* may not reach the required quality (e.g., conformal deposition). In some embodiments, dielectric liner 128* can prevent oxidation of the sidewalls of fin structures 108* during subsequent formation of STI regions 104. In some embodiments, dielectric liner 128* can improve uniformity of subsequently deposited semiconductor liner 130* and improve the formation window of spacer structures 127. In some embodiments, dielectric liner 128* can have a horizontal dimension 128t (e.g., thickness) along a Y-axis ranging from about 0.5 nm to about 2.5 nm. In some embodiments, a ratio of horizontal dimension 128t to vertical dimension 122t can range from about 0.05 to about 0.5. If horizontal dimension 128t is less than about 0.5 nm, or the ratio is less than about 0.05, dielectric liner 128 may not prevent an over etch during subsequent formation of isolation layer 124 (shown in FIG. 10). If horizontal dimension 128t is greater than about 2.5 nm, or the ratio is greater than about 0.5, parasitic capacitance between gate structures 112 and epitaxial fin structures 110 (shown in FIGS. 1A-1D) may be increased.

The deposition of dielectric liner 128* can be followed by the formation of semiconductor liner 130* on dielectric liner 128*, as shown in FIG. 4. In some embodiments, semiconductor liner 130 can include semiconductor materials, such as Si and SiGe, conformally formed on dielectric liner 128* by ALD, chemical vapor deposition (CVD), furnace growth, molecular beam epitaxy (MBE), or other suitable formation methods. In some embodiments, semiconductor liner 130* can have a thickness ranging from about 0.5 nm to about 2 nm. In some embodiments, semiconductor liner 130 can be optional and omitted. Semiconductor liner 130* can facilitate subsequent formation of cladding layers. In some embodiments, dielectric liner 128* can improve the uniformity of semiconductor liner 130*, which can further improve subsequent formation of cladding layer 638 (shown in FIG. 6) and spacer structures 127 (shown in FIG. 12).

Figure 5:
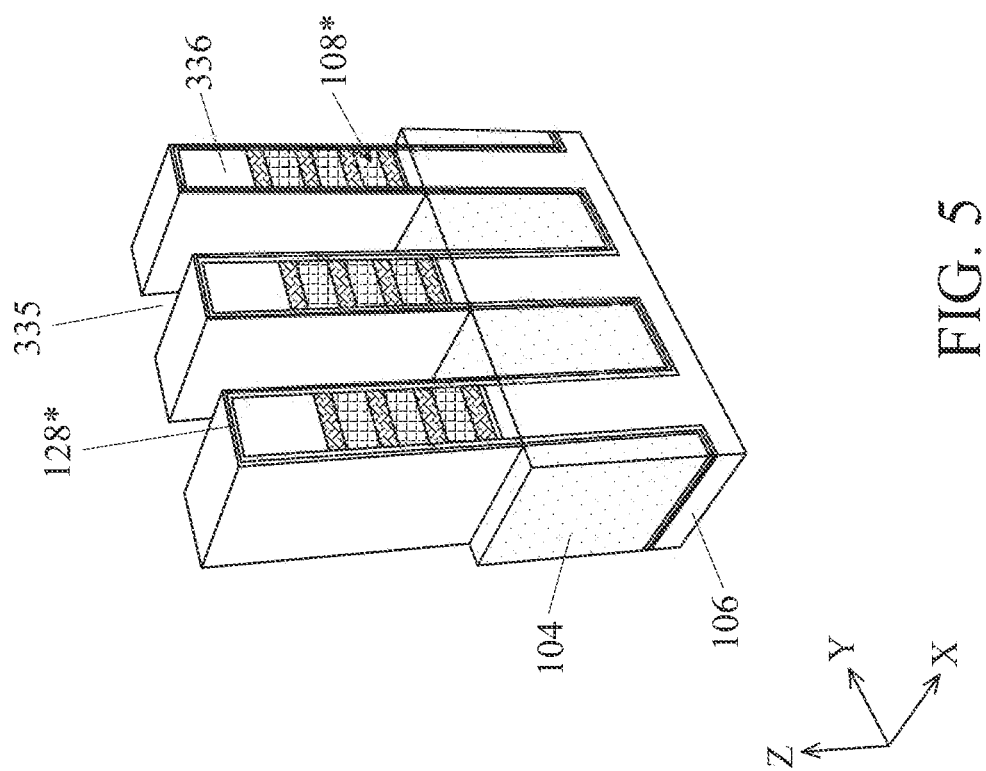

The formation of semiconductor liner 130* on dielectric liner 128* can be followed by the formation of STI regions 104, as shown in FIG. 5. In some embodiments, STI regions 104 can include dielectric materials, such as silicon oxide, silicon nitride, silicon oxynitride, fluorine-doped silicate glass (FSG), a low-k dielectric material, and other suitable insulating materials. In some embodiments, STI regions 104 can be formed by deposition of the dielectric material followed by a chemical mechanical polishing (CMP) and an etching process. The dielectric material can be deposited by flowable CVD (FCVD) or other suitable methods. In some embodiments, after the etching process, STI regions 104 can be below fin top portions 108B*.

Figure 6:
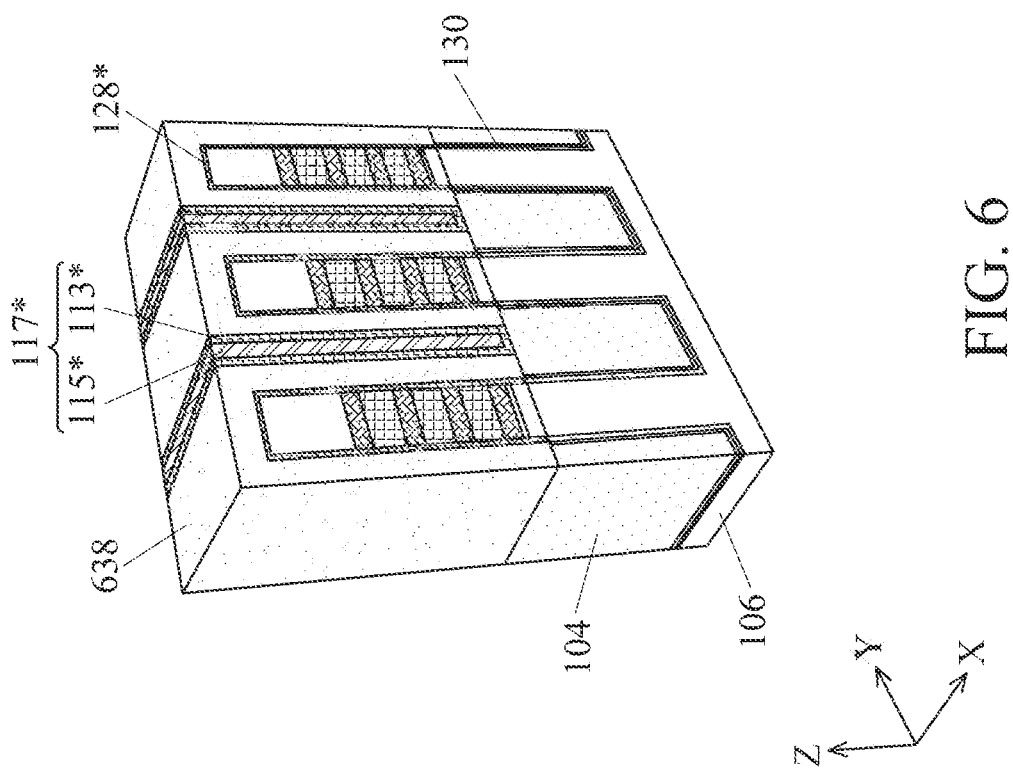

The formation of STI regions 104 can be followed by the formation of a cladding layer 638, as shown in FIG. 6. Cladding layer 638 can include semiconductor materials similar to or different from semiconductor liner 130*. In some embodiments, cladding layer 638 can include semiconductor materials with oxidation rates and/or etch selectivity similar to semiconductor layers 312 and lower than sacrificial semiconductor layer 324. In some embodiments, cladding layer 638 can include silicon germanium (SiGe) with Ge in a range from about 10 atomic percent to about 20 atomic percent with any remaining atomic percent being Si. Cladding layer 638 can be grown on semiconductor liner 130* by CVD, MBE, or other suitable methods. In some embodiments, cladding layer 638 can have a thickness ranging from about 5 nm to about 15 nm. Cladding layer 638 and semiconductor layers 312 can be replaced by gate structures 112 and spacer structures 127 in subsequent processes.

The formation of cladding layer 638 can be followed by the formation of hybrid structure 117*, as shown in FIG. 6. The formation of hybrid structure 117* can include deposition of first hybrid layer 113* and deposition of second hybrid layer 115* followed by a CMP process. In some embodiments, first hybrid layer 113* can include dielectric materials, such as silicon oxycarbonitride (SiOCN), deposited by ALD, CVD, or other suitable deposition methods. In some embodiments, second hybrid layer 115* can include dielectric materials, such as silicon oxide (SiOx), deposited by ALD, CVD, or other suitable deposition methods. The CMP process can stop on cladding layer 638 and co-planarize top surfaces of cladding layer 638 and hybrid structure 117*. In some embodiments, hybrid structure 117* can electrically isolate finFETs 102A-102C from each other.

Figure 7:
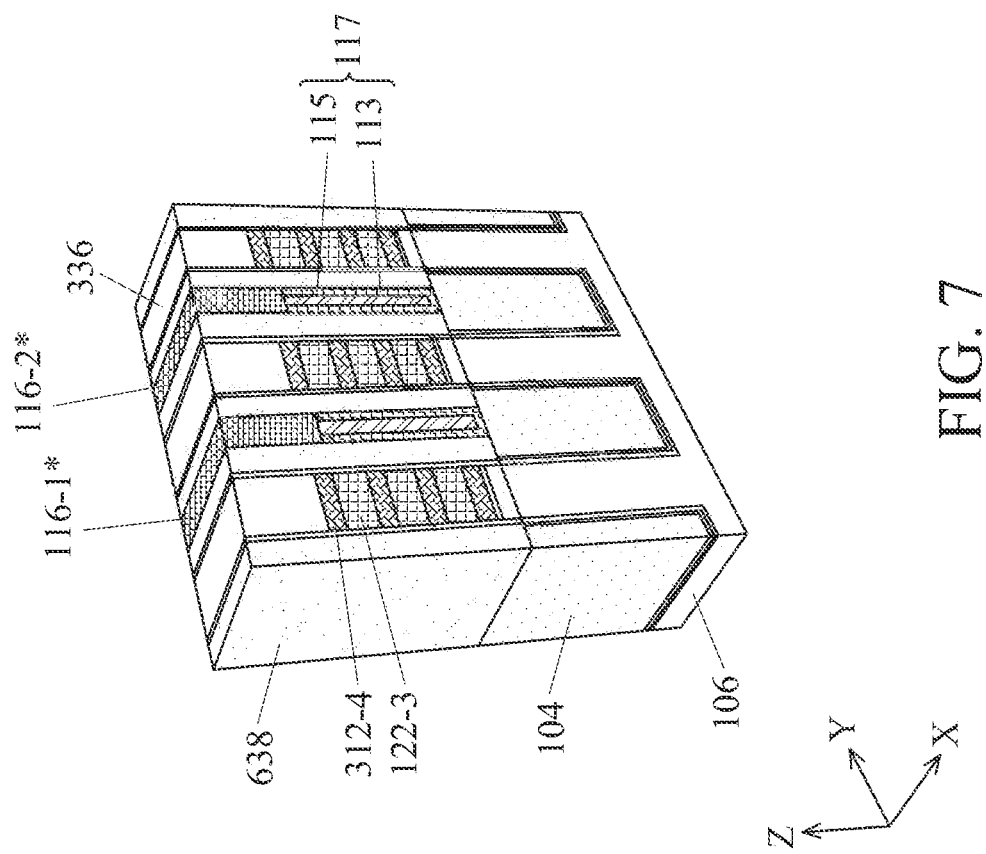

The formation of hybrid structure 117* can be followed by the formation of high-k dielectric structures 116-1* and 116-2*, as shown in FIG. 7. The formation of high-k dielectric structures 116-1* and 116-2* can include etching of hybrid structure 117* and deposition of high-k dielectric material layer followed by a CMP process. In some embodiments, after the etching process, top surfaces of hybrid structures 117 can be aligned with top surfaces of semiconductor layers 122-3. In some embodiments, high-k dielectric structures 116-1* and 116-2* can include high-k dielectric materials, such as hafnium oxide, deposited by CVD, ALD, or other suitable deposition methods. The CMP process can stop on hard mask layer 336 and co-planarize top surfaces of hard mask layer 336, cladding layer 638 and high-k dielectric structures 116-1* and 116-2*.

Figure 8:
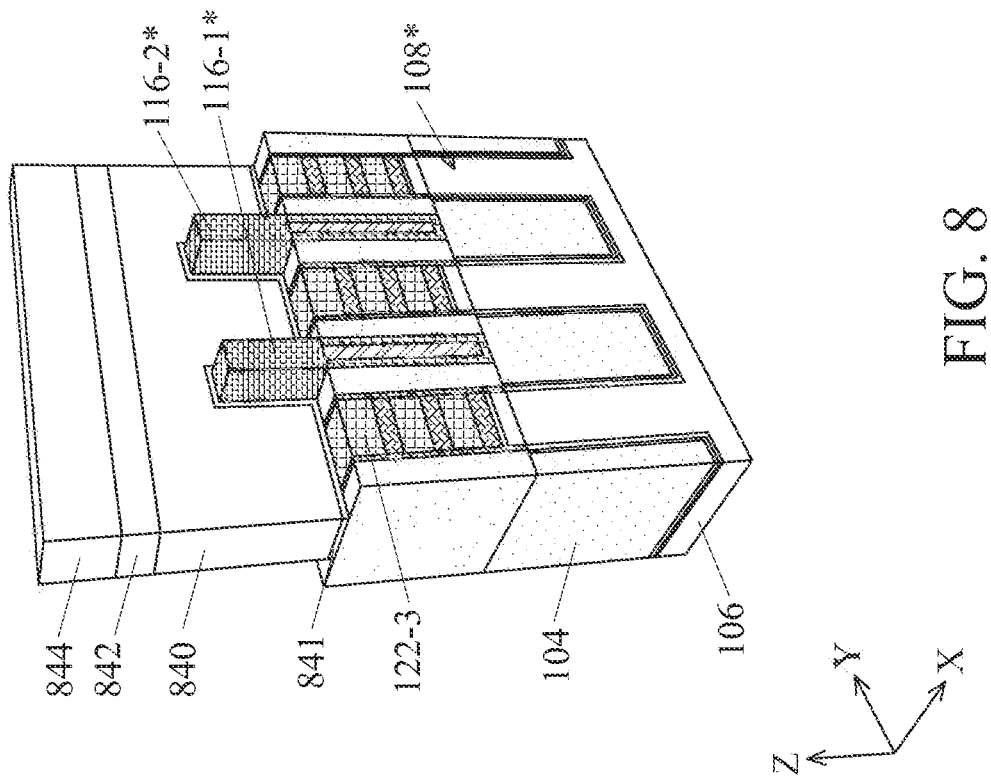

The formation of high-k dielectric structures 116-1* and 116-2* can be followed by the formation of sacrificial gate structures 840 on fin structures 108* and high-k dielectric structures 116-1* and 116-2*, as shown in FIG. 8. The formation of sacrificial gate structures 840 can include removal of hard mask layer 336, semiconductor layer 312-4, and a portion of cladding layer 638 by an etching process. In some embodiments, the etching process may not remove high-k dielectric structures 116-1* and 116-2* and can stop on semiconductor layer 122-3 due to etch selectivity between semiconductor layers 122 and 312. The formation of sacrificial gate structures 840 can further include deposition and patterning of a protective layer, a sacrificial gate layer, a first hard mask layer, and a second hard mask layer. Sacrificial gate structures 840 with protective layer 841, first hard mask layer 842, and second hard mask layer 844 can be patterned and etched for subsequent formation of gate structures 112. In some embodiments, protective layer 841 can include dielectric materials such as silicon oxide.

Figure 9:
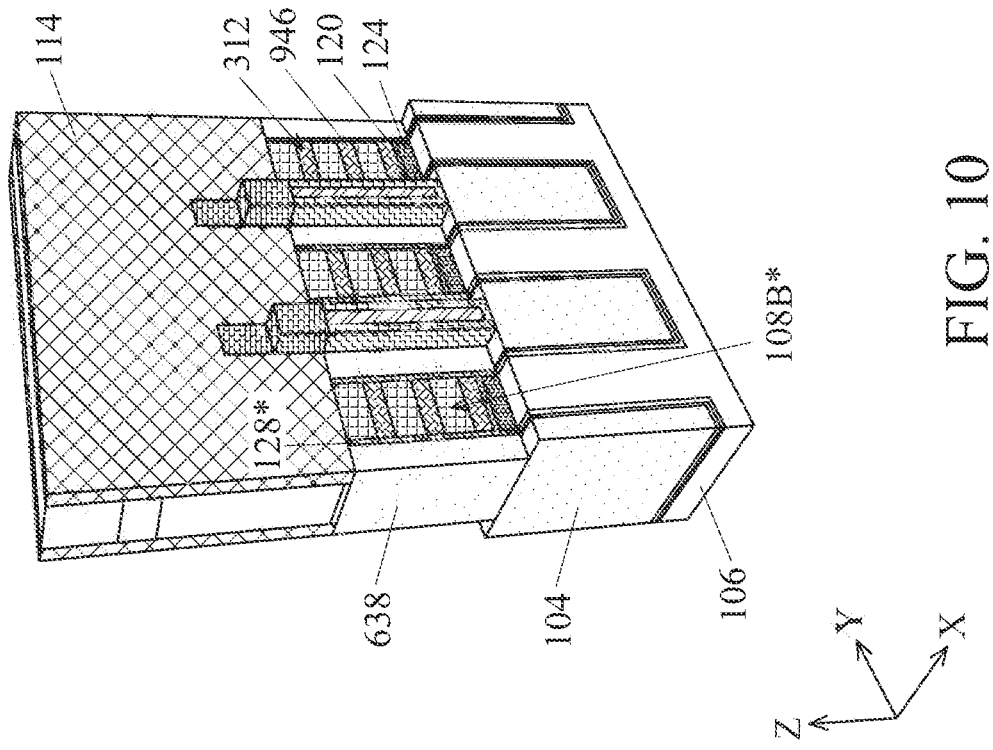

The formation of sacrificial gate structures 840 can be followed by the formation of gate spacers 114, as shown in FIG. 9. Gate spacers 114 can form on sidewalls of gate structures 112. The formation of gate spacers 114 can include conformal deposition of insulating materials and a directional etching of the deposited insulating materials. Gate spacers 114 can include insulating material, such as silicon oxide, silicon nitride, a low-k material, and a combination thereof conformally deposited by CVD, ALD, or other suitable deposition processes. The directional etching process can remove the deposited insulating materials on top surfaces but not on sidewalls of gate structures 112. Gate spacers 114 can include a single layer or a stack of insulating layers. The formation of gate spacers 114 can be followed by an etching process to form an opening 946. The etching process can remove a portion of fin top portions 108B* that is not underlying sacrificial gate structures 840 and gate spacers 114.

Figure 10:
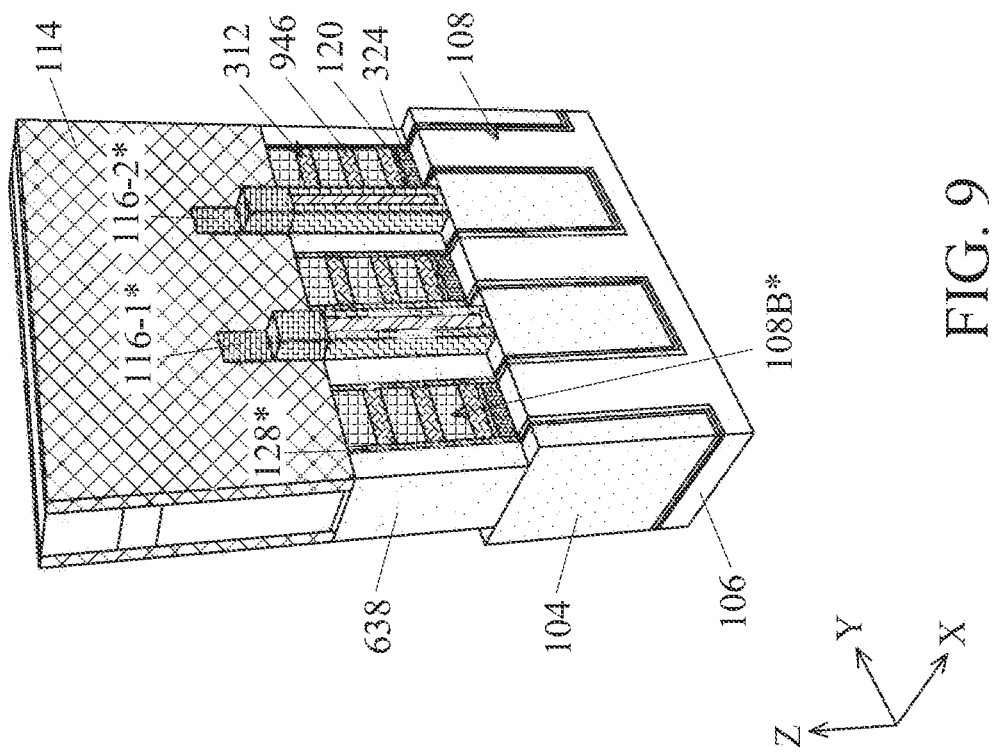

Referring to FIG. 2, in operation 230, the sacrificial semiconductor layer can be replaced with an insulating layer. For example, as shown in FIG. 10, sacrificial semiconductor layer 324 can be replaced with isolation layer 124. The replacement of sacrificial semiconductor layer 324 with isolation layer 124 can include removal of sacrificial semiconductor layer 324 and deposition of isolation layer 124 followed by a trim process. In some embodiments, sacrificial semiconductor layer 324 can be removed by an etching process including hydrogen fluoride (HF) and fluorine ($F_2$) as etchants. In some embodiments, the etching process can be performed at a pressure ranging from about 100 mTorr to about 2000 mTorr and a temperature ranging from about 10° C. to about 150° C. for an etching time ranging from about 30 seconds to about 300 seconds. In some embodiments, sacrificial semiconductor layer 324 can have a higher etch rate than semiconductor layers 312 and cladding layer 638 due to a higher Ge concentration. In some embodiments, dielectric liner 128* can prevent an etching of adjacent cladding layer 638 along a Y-axis during removal of sacrificial semiconductor layer 324, thus improving subsequent formation window of gate structures 112. In some embodiments, with dielectric liner 128*, the difference of the Ge concentration between sacrificial semiconductor layer 324 and semiconductor layers 312 may not need to be higher than about 30 atomic percent to provide a higher etch selectivity or prevent an over etch of cladding layer 638. In some embodiments, capping layer 120 can protect semiconductor layers 312 during removal of sacrificial semiconductor layer 324.

After the removal of sacrificial semiconductor layer 324, isolation layer 124 can be formed in the opening of removed sacrificial semiconductor layer 324. Isolation layer 124 can include dielectric materials, such as silicon oxide (SiOx) and silicon oxycarbonitride (SiOCN), deposited by ALD, CVD, or other suitable deposition methods. The deposited dielectric materials not underlying fin top portions 108B* can be etched in the trim process. In some embodiments, the trim process can be an etching process including hydrogen fluoride (HF) and ammonia ($NH_3$) as etchants. In some embodiments, the etching process can be performed at a pressure ranging from about 100 mTorr to about 2000 mTorr and a temperature ranging from about 10° C. to about 150° C. for an etching time ranging from about 10 seconds to about 120 seconds.

Figure 11:
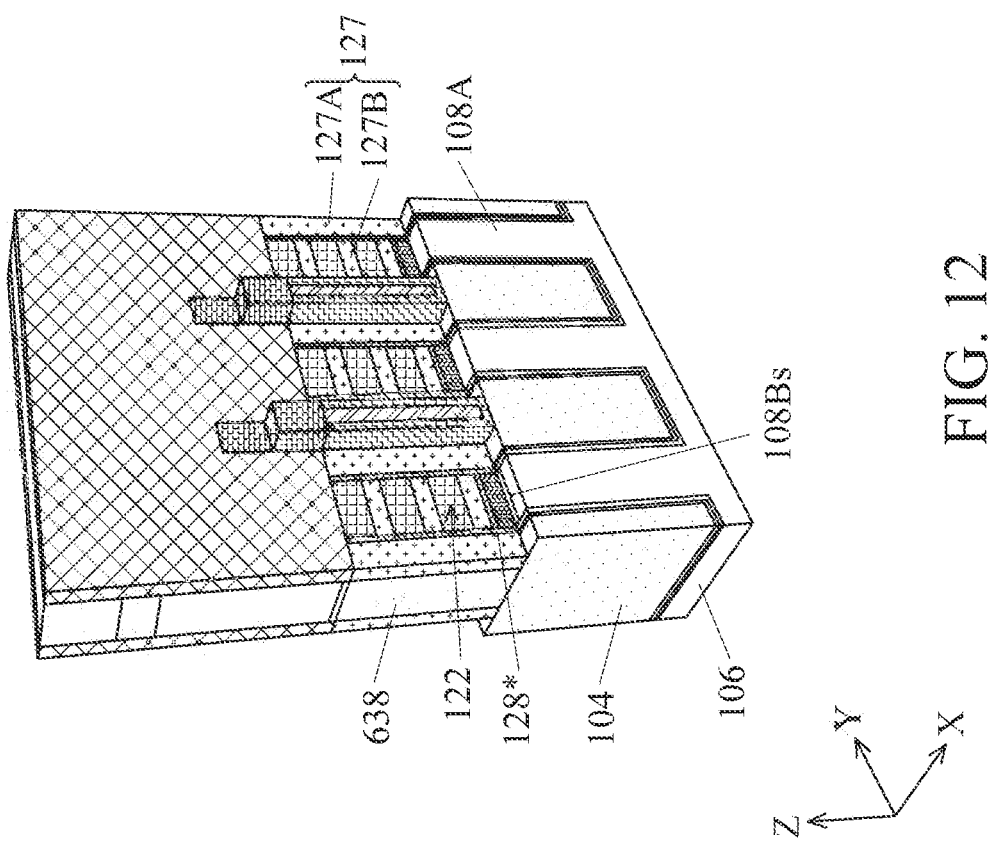
Figure 12:
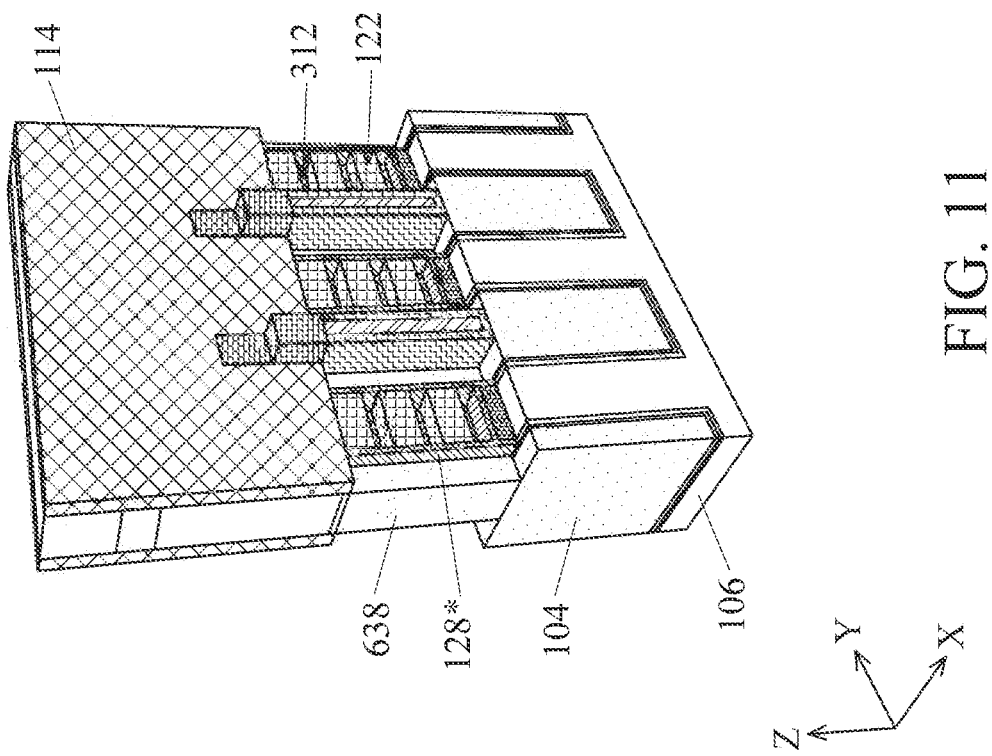

Referring to FIG. 2, in operation 240, a spacer structure can be formed in contact with the dielectric liner. For example, as shown in FIGS. 11 and 12, spacer structures 127 can be formed in contact with dielectric liner 128*. The formation of spacer structures 127 can include a lateral recess of semiconductor layers 312 and cladding layer 638. In some embodiments, semiconductor layers 312 and cladding layer 638 can be etched along an X-axis at a depth ranging from about 3 nm to about 10 nm during the lateral recess. Spacer structures 127 can include a dielectric material, such as silicon oxycarbide (SiOC), silicon carbonnitride (SiCN), silicon oxycarbonitride (SiOCN), silicon nitride (SiNx), silicon oxide (SiOx), silicon oxynitride (SiON), and a combination thereof, deposited by ALD, CVD, or other suitable deposition methods. The deposited dielectric material not underlying gate spacers can be etched to form spacer structures 127 in contact with dielectric liner 128* at ends of semiconductor layers 122. In some embodiments, spacer structures 127 can include a vertical portion 127A in contact with dielectric liner 128* and cladding layer 638, and a horizontal portion 127B in contact with dielectric liner 128* and between semiconductor layers 122. In some embodiments, dielectric liner 128* can avoid intersection of lateral recesses in semiconductor layers 312 and cladding layer 638 adjacent to the ends of semiconductor layers 122, which can improve spacer structures 127 merging window and avoid dishing or voids at the intersections of vertical portion 127A and horizontal portion 127B of spacer structures 127.

Figures 13, 14:
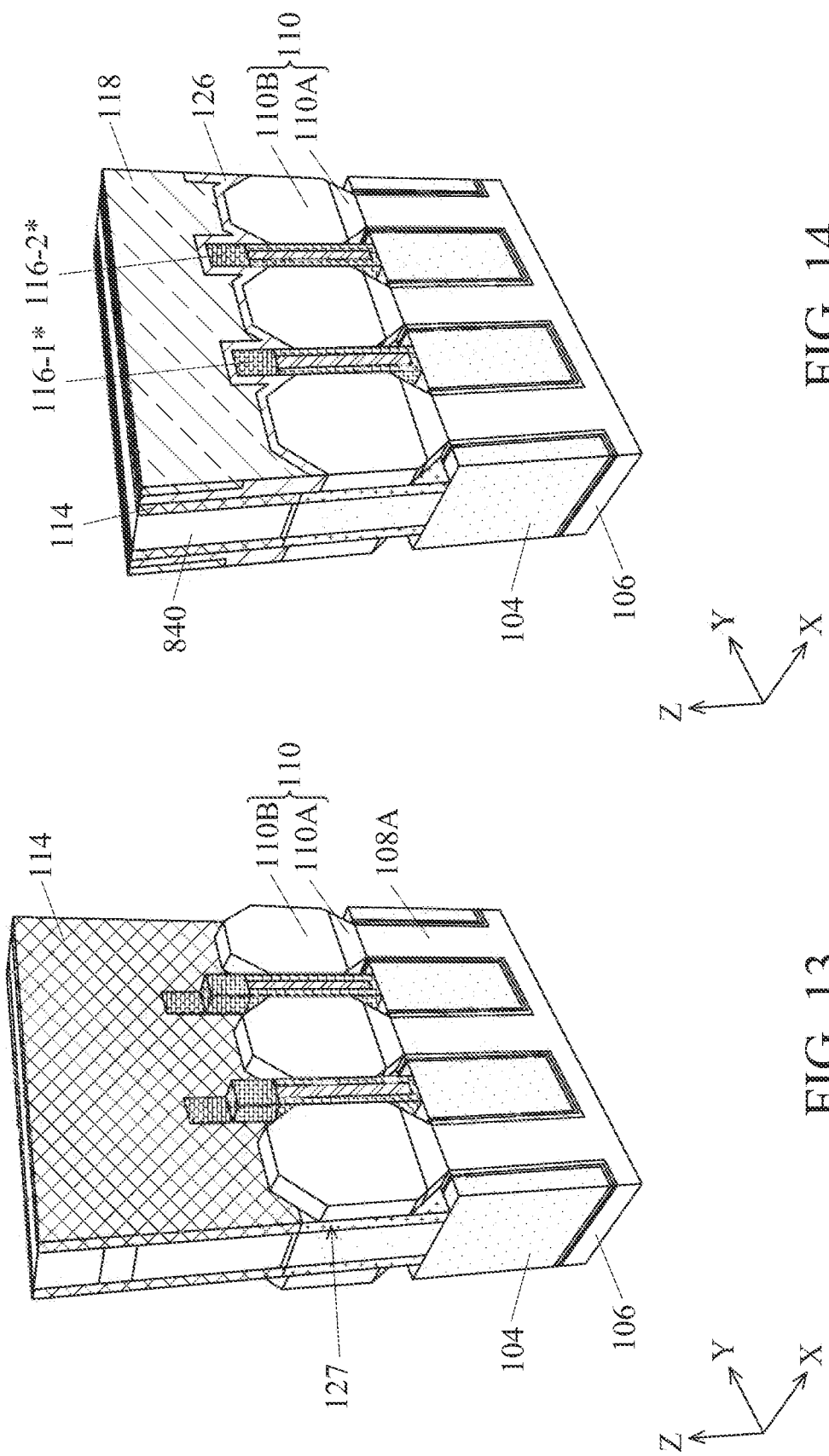

Referring to FIG. 2, in operation 250, an epitaxial fin structure can be formed on the fin bottom portion and in contact with the stacked fin structure and the dielectric liner. For example, as shown in FIGS. 12 and 13, epitaxial fin structures 110 can be formed on the fin bottom portions 108A and in contact with the stacked fin structures 108Bs and dielectric liner 128*. The formation of epitaxial fin structures 110 can include forming first epitaxial fin region 110A on fin bottom portions 108A and forming second epitaxial fin region 110B on first epitaxial fin region 110A. As described above, first epitaxial fin region 110A can be grown intrinsic and un-doped to reduce parasitic capacitance between gate structures 112 and epitaxial fin structures 110, and second epitaxial fin region 110B can be doped p-type or n-type to reduce contact resistances between S/D contact structures 132 and epitaxial fin structures 110. In some embodiments, a top surface of first epitaxial fin region 110A can be below semiconductor layers 122 of stacked fin structures 108Bs (shown in FIGS. 1A and 1B).

The formation of epitaxial fin structures 110 can be followed by the formation of ESL 126 and ILD layer 118, as shown in FIG. 14. ESL 126 can include dielectric materials, such as silicon nitride ($SiN_x$), silicon oxide ($SiO_x$), silicon oxynitride (SiON), and a combination thereof, blanket deposited by CVD, ALD, or other suitable deposition methods. ILD layer 118 can include dielectric materials, such as silicon oxide, deposited by flowable CVD (FCVD) or other suitable deposition methods. The deposition of ESL 126 and ILD layer 118 can be followed by a CMP process to co-planarize top surfaces of sacrificial gate structures 840, ESL 126, and ILD layer 118.

Figure 15:
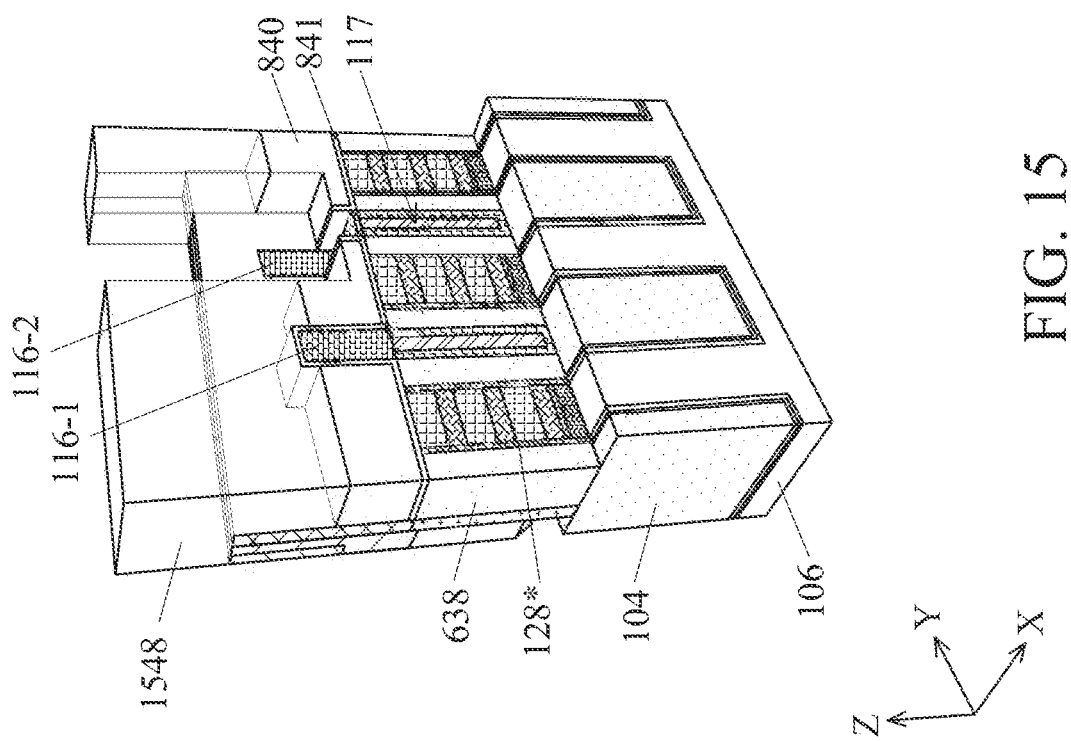

The formation of ESL 126 and ILD layer 118 can be followed by removal of high-k dielectric structure 116-2* in sacrificial gate structures 840, as shown in FIG. 15. FIGS. 15-20 illustrate partial isometric views of semiconductor device 100 along line D-D as shown in FIG. 1A, in accordance with some embodiments. Prior to the removal of high-k dielectric structure 116-2*, a top portion of sacrificial gate structures 840 can be removed to have a top surface lower than top surfaces of high-k dielectric structures 116-1* and 116-2*. A portion of high-k dielectric structure 116-2* in sacrificial gate structures 840 can be removed by depositing and patterning a mask layer 1548 and etching the portion of high-k dielectric structure 116-2*. In some embodiments, a portion of sacrificial gate structures 840 adjacent to high-k dielectric structure 116-2* can also be removed during the removal of high-k dielectric structure 116-2*.

Figure 16:
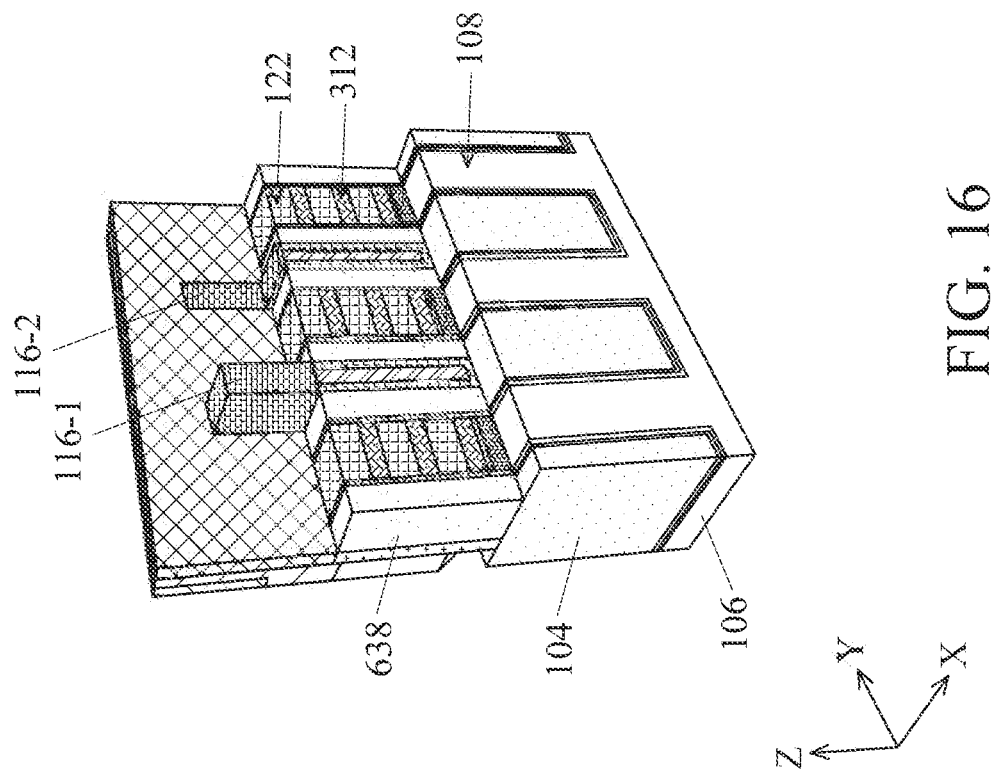

The removal of high-k dielectric structure 116-2* in sacrificial gate structures 840 can be followed by removal of sacrificial gate structures 840, as shown in FIG. 16. Mask layer 1548, sacrificial gate structures 840, and protective layer 841 can be removed to expose top surfaces of semiconductor layers 122 and cladding layer 638. High-k dielectric structures 116-1 and 116-2 may not be removed during the removal process.

Figure 17:
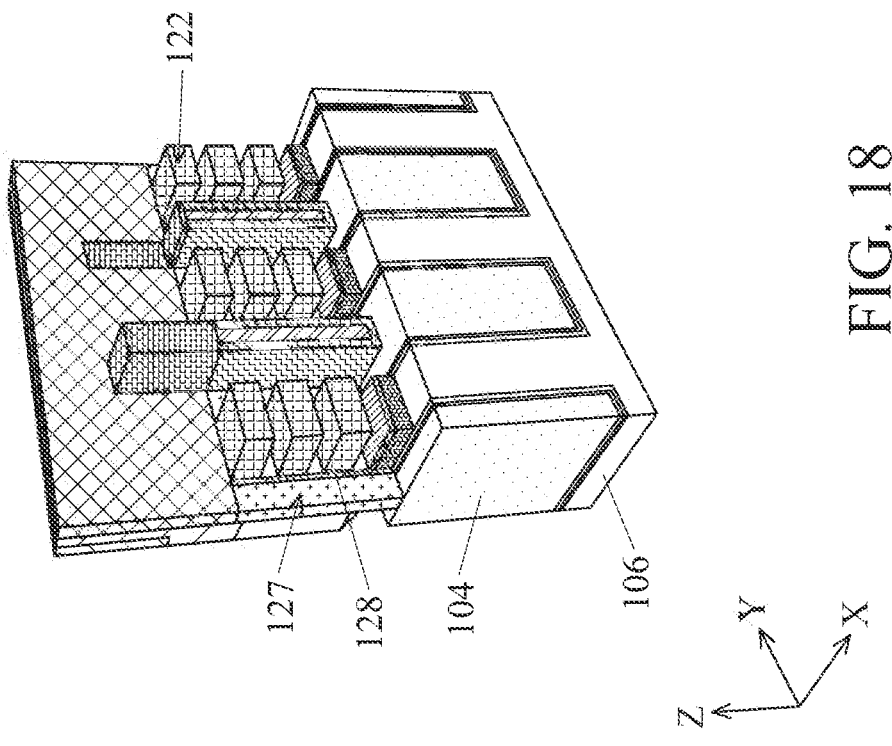
Figure 18:
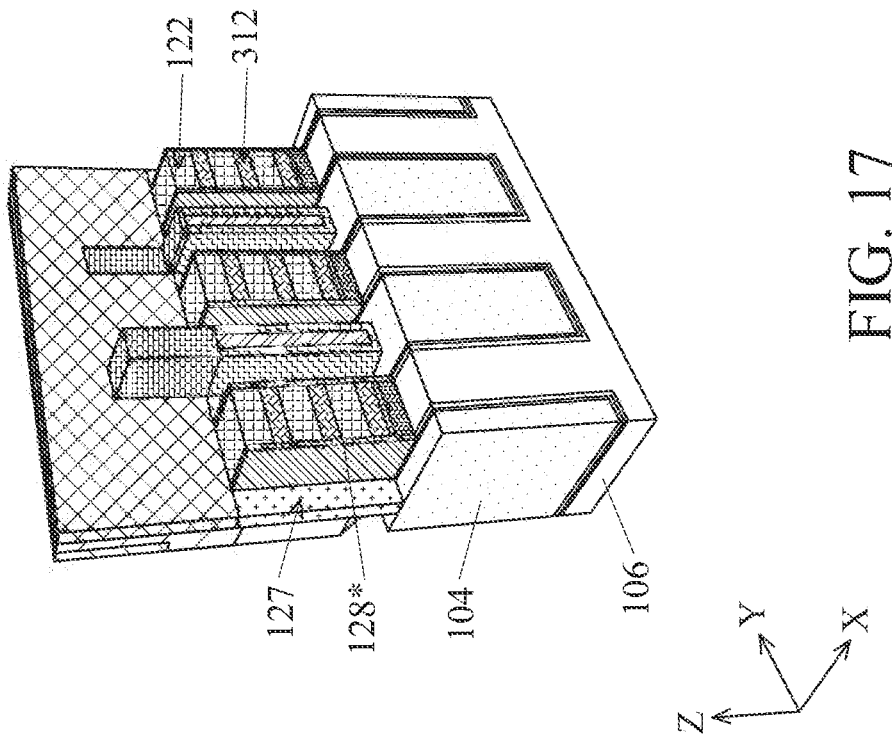

The removal of sacrificial gate structures 840 can be followed by the formation of sheets of semiconductor layers 122, as shown in FIGS. 17 and 18. The formation of sheets of semiconductor layers 122 can include removal of cladding layer 638 as shown in FIG. 17 and removal of semiconductor layers 312 as shown in FIG. 18. The removal of cladding layer 638 can include an etching process, such as a dry etching process, a wet etching process, and a combination thereof. The etching process can include multiple cycles of etching and purging processes. The etching process in each cycle can include using a gas mixture having hydrogen fluoride (HF) and a fluorine-based gas. The purging process in each cycle can include using a gas mixture having HF and nitrogen ($N_2$). HF in the purging process can remove by-products and/or clean the surface of etched portions for subsequent cycles. The purging process can be longer than the etching process in each cycle. With the protection of dielectric liner 128*, semiconductor layer 312 may not be etched during this etching process. Exposed semiconductor layers 122 may not be removed during the etching process due to the etch selectivity between semiconductor layers 122 and cladding layer 638.

The removal of cladding layer 638 can be followed by removal of semiconductor layers 312, as shown in FIG. 18. Prior to the removal of semiconductor layers 312, a portion of dielectric liner 128* not in spacer structures 127 can be removed by an etching process. The removal of semiconductor layers 312 can include an etching process similar to the removal of cladding layer 638. Semiconductor layers 122 may not be removed during the etching process due to the etch selectivity between semiconductor layers 122 and 312. After removal of semiconductor layers 312, sheets of semiconductor layers 122 (e.g., nanosheets or nanowires) can be formed between spacer structures 127. With dielectric liner 128*, the formation of sheets of semiconductor layers 122 can include two steps of removal of cladding layer 638 and semiconductor layers 312. Compared to removal of cladding layer 638 and semiconductor layers 312 in one step without dielectric liner 128*, the two-step removal with dielectric liner 128* can improve sheet uniformity of sheets of semiconductor layers 122. In addition, with dielectric liner 128*, cladding layer 638 can be fully removed and subsequent patterning window of gate structures 112 can be improved.

Figure 20:
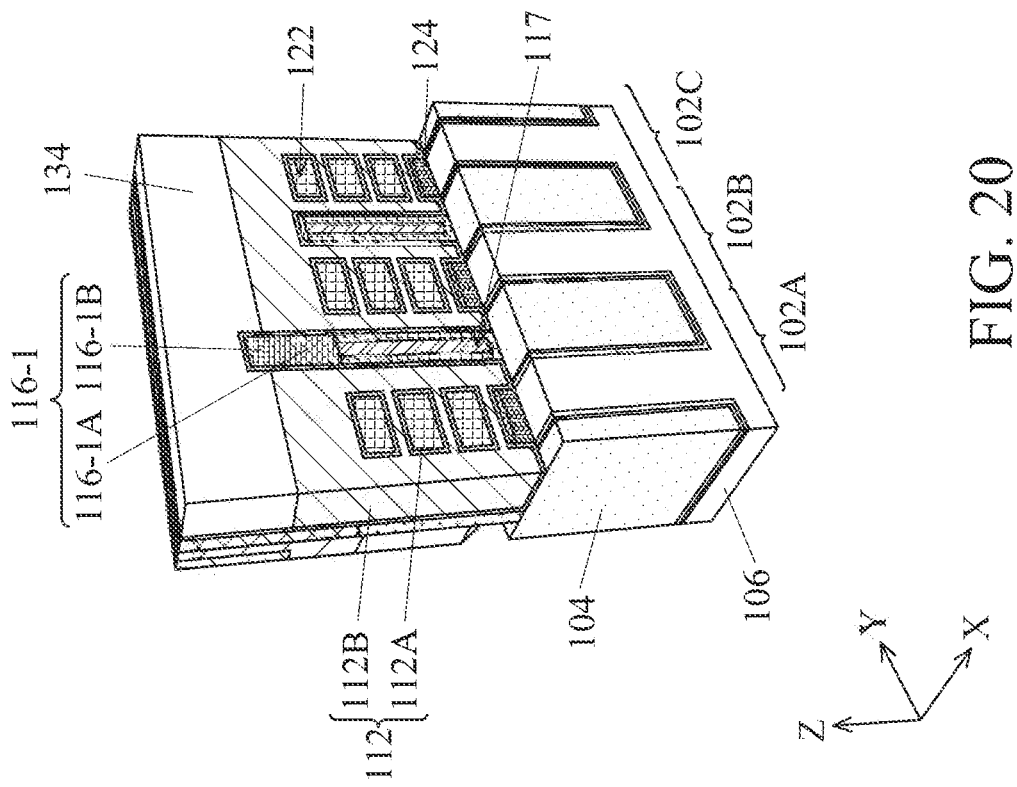
Figure 19:
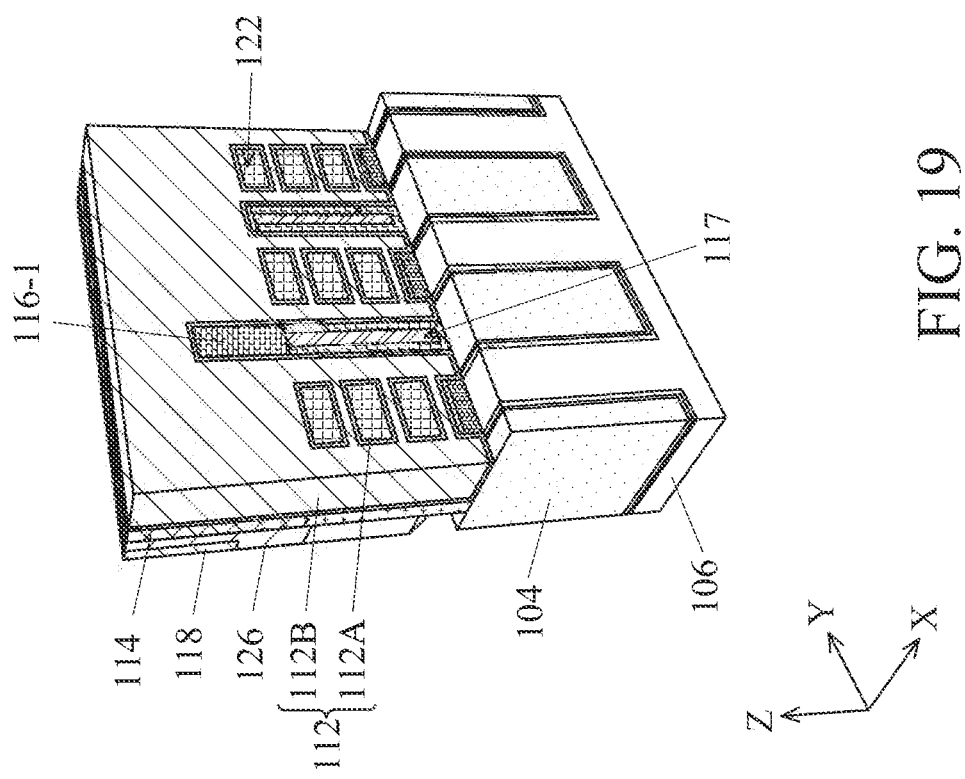

The formation of sheets of semiconductor layers 312 can be followed by the formation of gate structures 112 surrounding semiconductor layers 122, as shown in FIGS. 19 and 20. Gate structures 112 can include gate dielectric layer 112A and gate electrode 112B deposited by ALD, CVD, or other suitable deposition methods. The deposition of gate dielectric layer 112A and gate electrode 112B can be followed by a CMP process to co-planarize top surfaces of gate structures 112, gate spacers 114, ESL 126, and ILD layer 118. The formation of gate structures 112 can be followed by an etching process to remove a top portion of gate electrode 112B. After the etching process, gate capping structure 134 can be formed on gate structures 112. In some embodiments, high-k dielectric structure 116-1 can have a first portion 116-1A in gate structures 112 and a second portion 116-1B in gate capping structure 134. In some embodiments, a top surface of high-k dielectric structure 116-2 can be at a similar level to a top surface of semiconductor layers 122.

The formation of gate structures 112 can be followed by the formation of S/D contact structures 132, as shown in FIGS. 1A and 1B. The formation of S/D contact structures 132 can include forming a contact opening in which metal silicide layers and conductive regions can be deposited by ALD, CVD, PVD, and other suitable deposition methods followed by a CMP process of deposited conductive materials. S/D contact structures 132 can electrically connect respective S/D regions (e.g., epitaxial fin structures 110) of finFETs 102A-102C to other elements of semiconductor device 100 and/or of the integrated circuit.

Various embodiments in the present disclosure provide methods for forming semiconductor device 100 with dielectric liner 128. The example methods in the present disclosure can form semiconductor device 100 having fin structures 108, isolation layer 124 between stacked fin structures 108Bs and fin bottom portions 108A of fin structures 108, dielectric liner 128 in contact with the ends of stacked fin structures 108Bs, and spacer structures 127 in contact with dielectric liner 128. In some embodiments, dielectric liner 128 can include silicon oxide. Dielectric liner 128 can prevent an over etch during the formation of isolation layer 124 and improve the formation window of gate structures 112. In some embodiments, the dielectric liner can improve the formation window of spacer structures 127 to avoid voids and seams. In some embodiments, sheets of semiconductor layers 122 in stacked fin structures 108Bs can be formed in two steps with dielectric liner 128, which can improve the uniformity of the sheets of semiconductor layers 122.

In some embodiments, a semiconductor structure includes a substrate and a fin structure on the substrate. The fin structure includes a stacked fin structure, a fin bottom portion below the stacked fin structure, and an isolation layer between the stacked fin structure and the fin bottom portion.

The semiconductor structure further includes a dielectric liner in contact with an end of the stacked fin structure and a spacer structure in contact with the dielectric liner.

In some embodiments, a semiconductor device includes a fin structure on a substrate. The fin structure includes a fin top portion and a fin bottom portion. The fin top portion includes an epitaxial fin structure and a stacked fin structure having at least one semiconductor layer. The fin structure further includes an isolation layer between the stacked fin structure and the fin bottom portion. The semiconductor device further includes a gate structure surrounding the at least one semiconductor layer of the stacked fin structure, a spacer structure between the gate structure and the epitaxial fin structure, a dielectric liner between the stacked fin structure and the spacer structure, a capping structure on the gate structure, and a contact structure on the epitaxial fin structure.

In some embodiments, a method includes forming a fin structure on a substrate. The fin structure includes a fin top portion and a fin bottom portion. The fin top portion includes a stacked fin structure having multiple semiconductor layers. The fin structure further includes a semiconductor layer between the stacked fin structure and the fin bottom portion. The method further includes depositing a dielectric liner on the fin structure, replacing the semiconductor layer with an insulating layer, forming a spacer structure in contact with the dielectric liner, and forming an epitaxial fin structure on the fin bottom portion and in contact with the stacked fin structure and the dielectric liner.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a fin bottom portion on the substrate;
   a stacked nanostructure comprising a plurality of layers on the fin bottom portion; and
   an isolation layer between the stacked nanostructure and the fin bottom portion;
   a dielectric liner on a sidewall of the stacked nanostructure and in contact with an end of the stacked nanostructure; and
   a spacer structure between the plurality of layers of the stacked nanostructure and in contact with the dielectric liner.

2. The semiconductor structure of claim 1, wherein the spacer structure comprises a horizontal portion and a vertical portion, and wherein the dielectric liner is between the stacked nanostructure and the vertical portion of the spacer structure.

3. The semiconductor structure of claim 2, wherein the horizontal portion of the spacer structure has a first width and the vertical portion of the spacer structure has a second width equal to or greater than the first width.

4. The semiconductor structure of claim 1, further comprising a capping layer between the stacked nanostructure and the isolation layer.

5. The semiconductor structure of claim 1, further comprising an epitaxial fin structure in contact with the stacked nanostructure, wherein the epitaxial fin structure comprises a first epitaxial fin region on the fin bottom portion and a second epitaxial fin region on the first epitaxial fin region.

6. The semiconductor structure of claim 5, wherein the first epitaxial fin region is intrinsic and the second epitaxial fin region is doped.

7. The semiconductor structure of claim 5, wherein the first epitaxial fin region is below the stacked nanostructure.

8. The semiconductor structure of claim 1, further comprising a high-k dielectric structure between a gate structure on the stacked nanostructure and an adjacent gate structure on an adjacent stacked nanostructure, wherein the high-k dielectric structure has a portion above the gate structure and the adjacent gate structure.

9. A semiconductor device, comprising:
   a fin structure on a substrate, wherein the fin structure comprises:
      a fin top portion and a fin bottom portion, wherein the fin top portion comprises an epitaxial fin structure and a stacked fin structure having at least one semiconductor layer; and
      an isolation layer between the stacked fin structure and the fin bottom portion;
   a gate structure surrounding the at least one semiconductor layer of the stacked fin structure;
   a spacer structure between the gate structure and the epitaxial fin structure;
   a dielectric liner between the stacked fin structure and the spacer structure;
   a capping structure on the gate structure; and
   a contact structure on the epitaxial fin structure.

10. The semiconductor device of claim 9, wherein the spacer structure comprises a horizontal portion and a vertical portion, and wherein the dielectric liner is between the stacked fin structure and the vertical portion of the spacer structure.

11. The semiconductor device of claim 10, wherein the horizontal portion of the spacer structure has a first width and the vertical portion of the spacer structure has a second width equal to or greater than the first width.

12. The semiconductor device of claim 9, further comprising a capping layer between the stacked fin structure and the isolation layer.

13. The semiconductor device of claim 9, wherein the epitaxial fin structure comprises a first epitaxial fin region on the fin bottom portion and a second epitaxial fin region on the first epitaxial fin region.

14. The semiconductor device of claim 13, wherein the first epitaxial fin region is intrinsic and the second epitaxial fin region is doped.

15. The semiconductor device of claim 13, wherein the first epitaxial fin region is below the stacked fin structure.

16. The semiconductor device of claim 9, wherein the dielectric liner comprises silicon oxide.

17. A method, comprising:
  forming a fin structure on a substrate, wherein the fin structure comprises:
    a fin top portion and a fin bottom portion, wherein the fin top portion comprises a stacked fin structure having a plurality of semiconductor layers; and
    a semiconductor layer between the stacked fin structure and the fin bottom portion;
  depositing a dielectric liner on the fin structure;
  replacing the semiconductor layer with an insulating layer;
  forming a spacer structure in contact with the dielectric liner; and
  forming an epitaxial fin structure on the fin bottom portion and in contact with the stacked fin structure and the dielectric liner.

18. The method of claim 17, further comprising forming a capping layer between the stacked fin structure and the semiconductor layer.

19. The method of claim 17, wherein the forming the epitaxial fin structure comprises:
  forming a first epitaxial fin region on the fin bottom portion, wherein the first epitaxial fin region is intrinsic and below the stacked fin structure; and
  forming a second epitaxial fin region on the first epitaxial fin region, wherein the second epitaxial fin region is doped.

20. The method of claim 17, wherein the forming the spacer structure comprises:
  forming a vertical portion of the spacer structure having a first width in contact with the dielectric liner; and
  forming a horizontal portion of the spacer structure having a second width and between each of the plurality of semiconductor layers, wherein the second width is equal to or greater than the first width.

* * * * *